(12) United States Patent
Ma et al.

(10) Patent No.: US 11,175,248 B2
(45) Date of Patent: Nov. 16, 2021

(54) APPARATUS AND METHOD FOR DETECTING TIME-DEPENDENT DEFECTS IN A FAST-CHARGING DEVICE

(71) Applicant: ASML Netherlands B.V., Veldhoven (NL)

(72) Inventors: Long Ma, San Jose, CA (US); Chih-Yu Jen, San Jose, CA (US); Zhonghua Dong, Sunnyvale, CA (US); Peilei Zhang, San Jose, CA (US); Wei Fang, Milpitas, CA (US); Chuan Li, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/574,970

(22) Filed: Sep. 18, 2019

(65) Prior Publication Data

US 2020/0088659 A1      Mar. 19, 2020

Related U.S. Application Data

(60) Provisional application No. 62/733,040, filed on Sep. 18, 2018.

(51) Int. Cl.
*G01N 23/2251* (2018.01)
*H01J 37/28* (2006.01)

(52) U.S. Cl.
CPC .......... *G01N 23/2251* (2013.01); *H01J 37/28* (2013.01); *G06T 2207/10061* (2013.01);
(Continued)

(58) Field of Classification Search
CPC ......... G01N 23/2251; G01N 2223/646; G01N 2223/6116; H01J 37/28; H01J 2237/2817;
(Continued)

(56) References Cited

U.S. PATENT DOCUMENTS 6,512,843 B1 * 1/2003 Kuwabara ............. G03F 7/7065
382/149
6,606,401 B1 * 8/2003 Sender ............. G01N 21/95607
356/237.5

(Continued)

FOREIGN PATENT DOCUMENTS

TW       200603196 A    1/2006
TW       201405685 A    2/2014

OTHER PUBLICATIONS

International Search Report issued in related International Application No. PCT/EP2019/074585; dated Dec. 16, 2019 (3 pgs.).
(Continued)

*Primary Examiner* — David A Vanore
(74) *Attorney, Agent, or Firm* — Finnegan, Henderson, Farabow, Garrett & Dunner, LLP

(57) ABSTRACT

An improved charged particle beam inspection apparatus, and more particularly, a particle beam apparatus for inspecting a wafer including an improved scanning mechanism for detecting fast-charging defects is disclosed. An improved charged particle beam inspection apparatus may include a charged particle beam source that delivers charged particles to an area of the wafer and scans the area. The improved charged particle beam apparatus may further include a controller including a circuitry to produce multiple images of the area over a time sequence, which are compared to detect fast-charging defects.

15 Claims, 18 Drawing Sheets

(52) U.S. Cl.
CPC ............... *G06T 2207/30148* (2013.01); *H01J 2237/2817* (2013.01)

(58) Field of Classification Search
CPC . H01J 2237/24564; G06T 2207/10061; G06T 2207/30148
USPC .................... 250/492.1, 492.2; 382/144, 149
See application file for complete search history.

(56) References Cited

U.S. PATENT DOCUMENTS

| | | | |
|---|---|---|---|
| 6,643,394 B1* | 11/2003 | Kuwabara | G01N 21/95607 382/144 |
| 6,778,257 B2* | 8/2004 | Bleeker | G03F 7/70283 353/30 |
| 7,333,177 B2* | 2/2008 | Gui | G03F 7/70291 355/53 |
| 7,453,274 B1 | 11/2008 | Zhong et al. | |
| 8,712,184 B1* | 4/2014 | Liao | G06K 9/40 382/275 |
| 9,805,910 B1 | 10/2017 | Trease et al. | |
| 2004/0026633 A1 | 2/2004 | Gunji et al. | |
| 2008/0099675 A1 | 5/2008 | Hiroi et al. | |
| 2010/0142800 A1* | 6/2010 | Pak | G06T 7/001 382/149 |
| 2010/0314539 A1* | 12/2010 | Xiao | H01J 37/1474 250/307 |
| 2011/0036981 A1 | 2/2011 | Zhao et al. | |
| 2012/0062269 A1 | 3/2012 | Patterson | |
| 2014/0061462 A1 | 3/2014 | Park et al. | |
| 2015/0069232 A1* | 3/2015 | Lin | G03F 7/7065 250/307 |
| 2016/0148781 A1 | 5/2016 | Tsuno et al. | |
| 2017/0032929 A1 | 2/2017 | Lei et al. | |

OTHER PUBLICATIONS

Office Action issued by the Intellectual Property Office (IPO) in related ROC (Taiwan) Patent Application No. 108132959; dated Feb. 5, 2021 (11 pgs.).

* cited by examiner

APPARATUS AND METHOD FOR DETECTING TIME-DEPENDENT DEFECTS IN A FAST-CHARGING DEVICE

CROSS-REFERENCE TO RELATED APPLICATIONS

This application claims priority of U.S. application 62/733,040 which was filed on Sep. 18, 2018, and which is incorporated herein by reference in its entirety.

FIELD

The embodiments provided herein disclose a particle beam inspection apparatus, and more particularly, a particle beam inspection apparatus including an improved scanning mechanism.

BACKGROUND

When manufacturing semiconductor integrated circuit (IC) chips, pattern defects or uninvited particles (residuals) inevitably appear on a wafer or a mask during fabrication processes, thereby reducing the yield. For example, uninvited particles may be troublesome for patterns with smaller critical feature dimensions, which have been adopted to meet the increasingly more advanced performance requirements of IC chips.

Pattern inspection tools with a charged particle beam have been used to detect the defects or uninvited particles. These tools typically employ a scanning electron microscope (SEM). In a SEM, a beam of primary electrons having a relatively high energy is decelerated to land on a sample at a relatively low landing energy and is focused to form a probe spot thereon. Due to this focused probe spot of primary electrons, secondary electrons will be generated from the surface. The secondary electrons may comprise backscattered electrons, secondary electrons, or Auger electrons, resulting from the interactions of the primary electrons with the wafer. By scanning the probe spot over the sample surface and collecting the secondary electrons, pattern inspection tools may obtain an image of the sample surface.

SUMMARY

The embodiments provided herein disclose a charged particle beam system for inspecting a wafer, and more particularly, a charged particle beam system for inspecting a wafer including an improved scanning mechanism.

In some embodiments, the charged particle beam system for inspecting a wafer includes a charged particle beam source and a controller. The charged particle beam source includes circuitry to deliver charged particles to a surface of the wafer over a time sequence. The circuitry in the charged particle beam source also scans an area of the wafer, wherein the area comprises a plurality of rows of pixels. The controller includes circuitry to produce a set of N images of the area over the time sequence. N may be an integer. The controller includes circuitry to compare the set of N images to detect a defect that results in a high resistance structure in the area of the wafer.

In some embodiments, a method of inspecting a wafer is provided. The method uses a charged particle beam system with a charged particle beam source to deliver charged particles to a surface of the wafer over a time sequence. The method includes scanning an area of the wafer, wherein the area comprises a plurality of rows of pixels. The method also includes producing a set of N images of the area over the time sequence, wherein N is an integer. The method further includes comparing the set of N images to detect a defect that results in a high resistance structure in the area of the wafer.

In some embodiments, a non-transitory computer readable medium storing a set of instructions that is executable by a processor of a charged particle beam system is provided. The instructions cause the charged particle beam system, with a charged particle beam source to deliver charged particles to a surface of a wafer over a time sequence, to perform a method. The method includes scanning an area of the wafer, wherein the area comprises a plurality of rows of pixels. The method also includes producing a set of N images of the area over the time sequence, wherein N is an integer. The method further includes comparing the set of N images to detect a defect that results in a high resistance structure in the area of the wafer.

Other advantages of the present invention will become apparent from the following description taken in conjunction with the accompanying drawings wherein are set forth, by way of illustration and example, certain embodiments of the present invention.

BRIEF DESCRIPTION OF FIGURES

The above and other aspects of the present disclosure will become more apparent from the description of exemplary embodiments, taken in conjunction with the accompanying drawings.

DETAILED DESCRIPTION

Figure 1:
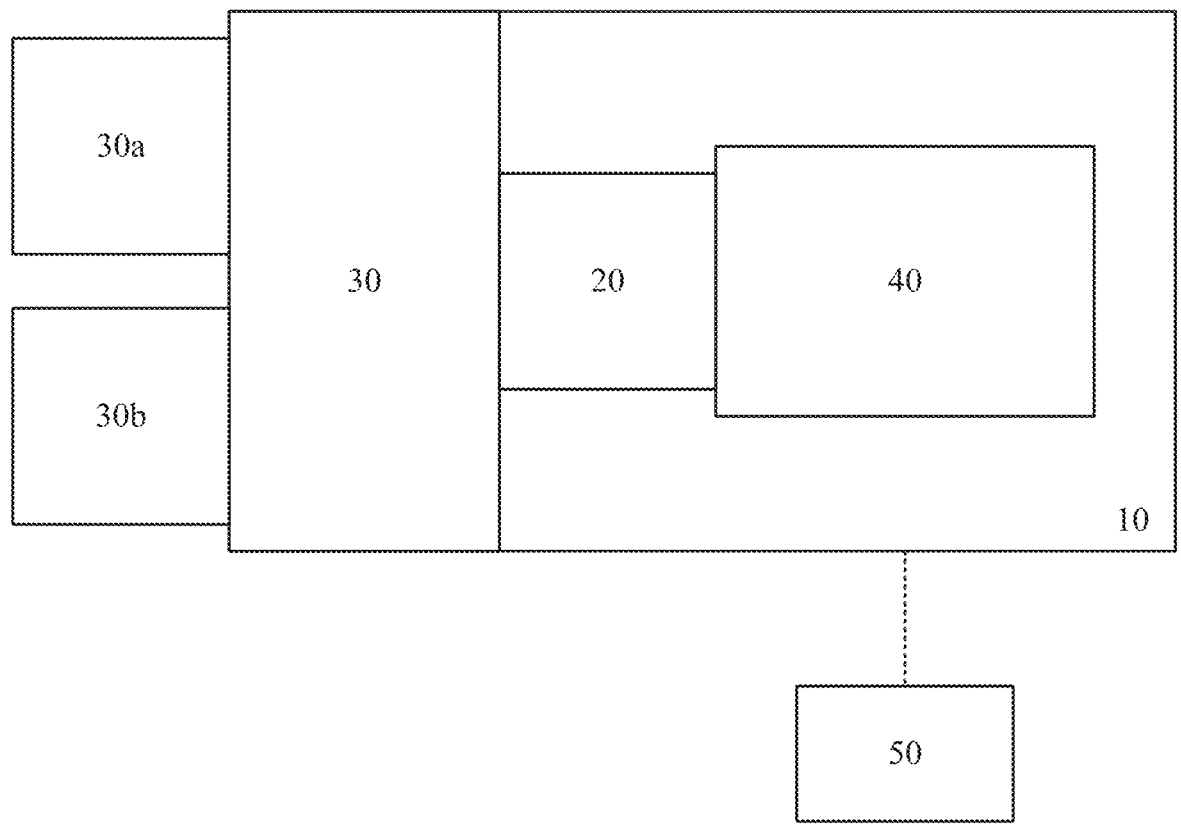
FIG. 1 is a schematic diagram illustrating an exemplary charged particle beam inspection system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The enhanced computing power of electronic devices, while reducing the physical size of the devices, can be accomplished by significantly increasing the packing density of circuit components such as transistors, capacitors, diodes, etc. on an IC chip. For example, an IC chip of a smart phone, which is the size of a thumbnail, may include over 2 billion transistors, the size of each transistor being less than 1/1000th of a human hair. Thus, it is not surprising that semiconductor IC manufacturing is a complex and time-consuming process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get to a 75% yield, each individual step must have a yield greater than 99.4%, and if the individual step yield is 95%, the overall process yield drops to 7%.

While high process yield is desirable in an IC chip manufacturing facility, maintaining a high wafer throughput, defined as the number of wafers processed per hour, is also essential. High process yields and high wafer throughput can be impacted by the presence of defects, especially if operator intervention is required for reviewing the defects. Thus, high throughput detection and identification of micro and nano-sized defects by inspection tools (such as a SEM) is essential for maintaining high yields and low cost.

A SEM scans the surface of a wafer with a focused beam of electrons. The electrons interact with the wafer and generate secondary electrons. By scanning the wafer with an electron beam and capturing the secondary electrons with a detector, a SEM creates an image of the wafer that shows the internal device structure under the area of the wafer being inspected. A conventional SEM inspection tool obtains a single image of an area of a wafer and compares the obtained image against a reference image that represents the corresponding device structures absent any defect. A difference detected from the comparison of the images may indicate a defect in the wafer.

However, such a conventional inspection technique, e.g., capturing only a single image at an arbitrary point of time, may not be useful to identify a defect in a thin device structure, because the electrical characteristics of the defective thin structure changes over time. For example, even if a defect actually exists in the wafer under inspection, due to such a time-dependent behavior of a thin structure, sometimes the single obtained image may be captured at the right moment and show a difference from the reference image, but other times the obtained image may fail to show any difference at all. Therefore, a conventional SEM inspection tool cannot reliably identify a defect in a thin device structure.

Some of the newer SEMs obtain multiple images from the same area of the wafer. By comparing the multiple images of the same location (with those images being sampled at different times), these newer SEMs may detect a change of the electric characteristics caused by a thin device defect within the area of the wafer.

However, even these newer SEMs may not be able to catch super-fast time-dependent defects that are often present in high resistance device structures. A significant problem even these newer SEMS may face is that the conventional electron scanning mechanism used in these SEMs is not fast enough to obtain multiple images at the high rate required to identify the super-fast time-dependent defects.

One aspect of the present disclosure includes an improved scanning mechanism that can generate multiple images continuously at very high speed, such that the SEM can reliably detect the super-fast time-dependent defects. For example, the improved scanning mechanism employs row-by-row or pixel-by-pixel scanning, thereby substantially increasing the image sampling speed in some embodiments.

Relative dimensions of components in drawings may be exaggerated for clarity. Within the following description of drawings the same or like reference numbers refer to the same or like components or entities, and only the differences with respect to the individual embodiments are described. As used herein, unless specifically stated otherwise, the term "or" encompasses all possible combinations, except where infeasible. For example, if it is stated that a database can include A or B, then, unless specifically stated otherwise or infeasible, the database can include A, or B, or A and B. As a second example, if it is stated that a database can include A, B, or C, then, unless specifically stated otherwise or infeasible, the database can include A, or B, or C, or A and B, or A and C, or B and C, or A and B and C.

Reference is now made to FIG. 1, which is a schematic diagram illustrating an exemplary charged particle beam inspection system 100, consistent with embodiments of the present disclosure. As shown in FIG. 1, charged particle beam inspection system 100 includes a main chamber 10, a load lock chamber 20, an electron beam tool 40, and an equipment front end module (EFEM) 30. Electron beam tool 40 is located within main chamber 10. While the description and drawings are directed to an electron beam, it is appreciated that the embodiments are not used to limit the present disclosure to specific charged particles.

EFEM 30 includes a first loading port 30a and a second loading port 30b. EFEM 30 may include additional loading port(s). First loading port 30a and second loading port 30b may, for example, receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load lock chamber 20.

Load lock chamber 20 may be connected to a load lock vacuum pump system (not shown), which removes gas molecules in load lock chamber 20 to reach a first pressure below the atmospheric pressure. After reaching the first pressure, one or more robot arms (not shown) transport the wafer from load lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 40. In some embodiments, electron beam tool 40 may comprise a single beam electron inspection tool. In other embodiments, electron beam tool 40 may comprise a multi-beam electron inspection tool.

A controller 50 is electronically connected to electron beam tool 40. Controller 50 may be a computer configured to execute various controls of charged particle beam inspection system 100. While controller 50 is shown in FIG. 1 as being outside of the structure that includes main chamber 10, load lock chamber 20, and EFEM 30, it is appreciated that controller 50 may be part of the structure. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools that operate under the second pressure.

Figure 2:
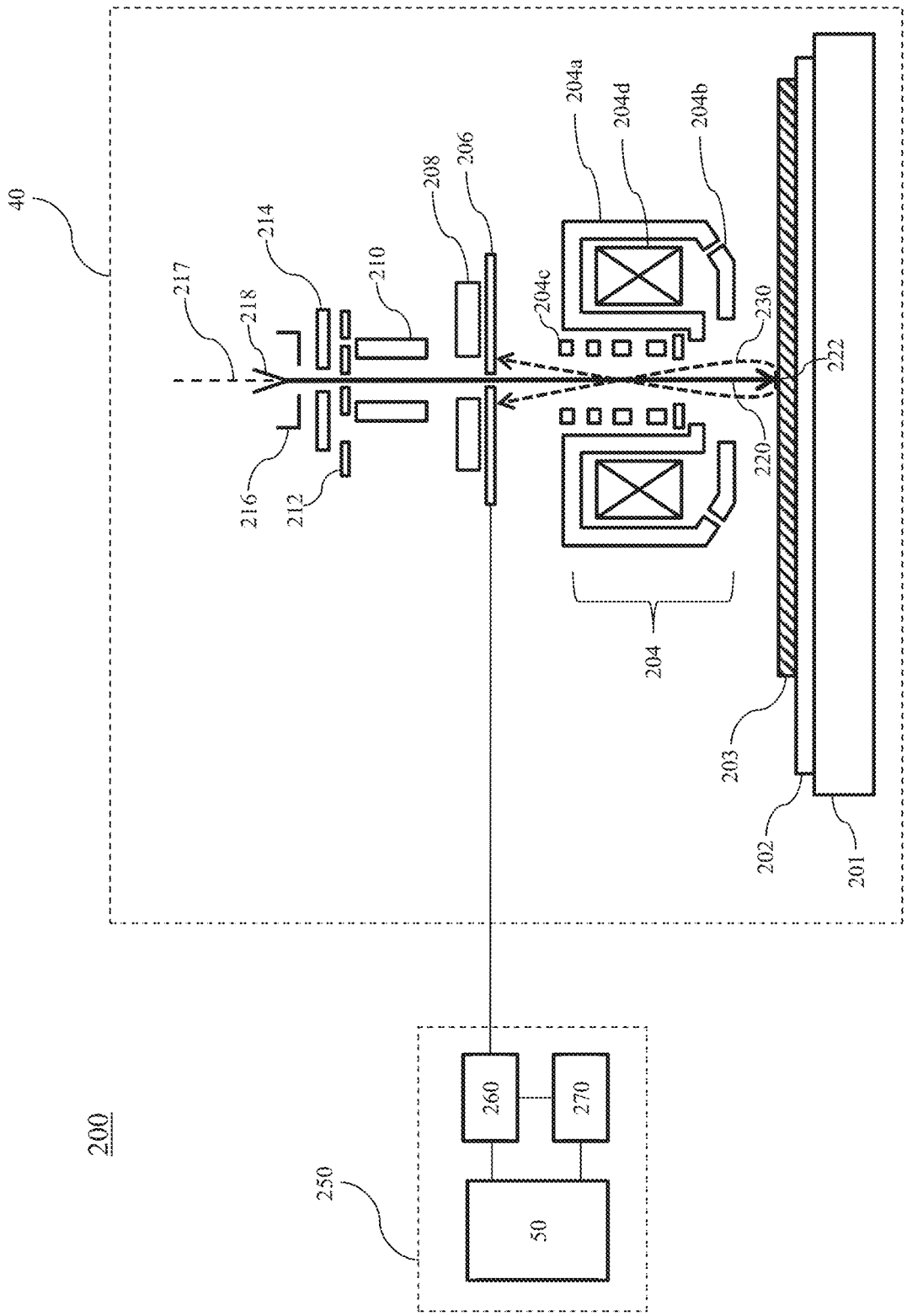
FIG. 2 is a schematic diagram illustrating an exemplary electron beam tool, consistent with embodiments of the present disclosure.

Reference is now made to FIG. 2, which is a schematic diagram illustrating an exemplary imaging system 200, comprising an electron beam tool 40 and an image processing system 250, consistent with embodiments of the present disclosure.

As shown in FIG. 2, electron beam tool 40 may include a motorized stage 201, and a wafer holder 202 supported by motorized stage 201 to hold a wafer 203 to be inspected. Electron beam tool 40 may further include a compound objective lens 204, electron detector 206 (which includes electron sensor surfaces), an objective aperture 208, a condenser lens 210, a beam limit aperture 212, a gun aperture 214, an anode 216, and a cathode 218, one or more of which may be aligned with an optical axis 217 of electron beam tool 40. In some embodiments, detector 206 may be arranged off axis 217.

Compound objective lens 204, in some embodiments, may include a modified swing objective retarding immersion lens (SORIL), which may include a pole piece 204a, a control electrode 204b, a deflector or a set of deflectors 204c, and an exciting coil 204d. Electron beam tool 40 may additionally include an energy dispersive X-ray spectrometer (EDS) detector (not shown) to characterize the materials on the wafer.

A primary electron beam 220 may be emitted from cathode 218 by applying a voltage between anode 216 and cathode 218. Primary electron beam 220 may pass through gun aperture 214 and beam limit aperture 212, both of which may determine the current of electron beam entering condenser lens 210, which resides below beam limit aperture 212. Condenser lens 210 may focus primary electron beam 220 before the beam enters objective aperture 208 to set the current of the electron beam before entering compound objective lens 204.

Compound objective lens 204 may focus primary electron beam 220 onto wafer 203 for inspection and can form a probe spot 222 on surface of wafer 203. Deflector(s) 204c may deflect primary electron beam 220 to scan probe spot 222 over wafer 203. For example, in a scanning process, deflector(s) 204c may be controlled to deflect primary electron beam 220 sequentially onto different locations of top surface of wafer 203 at different time points, to provide data for image reconstruction for different parts of wafer 203. Moreover, in some embodiments, deflector 204c may also be controlled to deflect primary electron beam 220 onto different sides of wafer 203 at a particular location, at different time points, to provide data for stereo image reconstruction of the wafer structure at that location. Further, in some embodiments, anode 216 and cathode 218 may be configured to generate multiple primary electron beams 220, and electron beam tool 40 may include a plurality of deflectors 204c to project the multiple primary electron beams 220 to different parts/sides of wafer 203 at the same time.

When a current is applied onto exciting coil 204d, an axially-symmetric (i.e., symmetric around optical axis 217) magnetic field may be generated in the wafer surface area. A part of wafer 203 being scanned by primary electron beam 220 may be immersed in the magnetic field. In some embodiments, different voltages may be applied onto wafer 203, pole piece 204a, and control electrode 204b, to generate an axial symmetric retarding electric field near the wafer surface. The electric field may reduce the energy of impinging primary electron beam 220 near the surface of the wafer before electrons of the beam collide with wafer 203. Control electrode 204b, being electrically isolated from pole piece 204a, may control an axially-symmetric electric field on the wafer to prevent micro-arcing of the wafer and to ensure proper beam focus at the wafer surface with the axially-symmetric magnetic field together.

A secondary electron beam 230 may be emitted from the part of wafer 203 upon receiving primary electron beam 220. Secondary electron beam 230 may comprise backscattered electrons, secondary electrons, or Auger electrons, resulting from the interactions of the primary electrons with wafer 203. Secondary electron beam 230 may be received by sensor surfaces of electron detector 206. In some embodiments, electron detector 206 may generate a signal (e.g., a voltage, a current, etc.) that represents an intensity of secondary electron beam 230 and may provide the signal to image processing system 250 in communication with electron detector 206. The intensity of secondary electron beam 230 may vary according to the external or internal structure of wafer 203, and thus may indicate whether wafer 203 includes defects. Moreover, as discussed above, primary electron beam 220 may be projected onto different locations of the top surface of wafer 203, or different sides of wafer 203 at a particular location, to generate secondary electron beams 230 of different intensities. Therefore, by mapping the intensity of secondary electron beam 230 with the areas of wafer 203, image processing system 250 may reconstruct an image that reflects the characteristics of internal or external structures of wafer 203.

In some embodiments, imaging system 200 may also comprise image processing system 250 that includes an image acquirer 260, a storage 270, and controller 50. Image acquirer 260 may comprise one or more processors. For example, image acquirer 260 may comprise a computer, server, mainframe host, terminals, personal computer, any kind of mobile computing devices, and the like, or a combination thereof. Image acquirer 260 may be communicatively coupled to a detector 206 of electron beam tool 40 through a medium such as an electrical conductor, optical fiber cable, portable storage media, IR, Bluetooth, internet, wireless network, wireless radio, or a combination thereof. In some embodiments, image acquirer 260 may receive a signal from detector 206 and may construct an image. Image acquirer 260 may thus acquire images of wafer 203. Image acquirer 260 may also perform various post-processing functions, such as generating contours, superimposing indicators on an acquired image, and the like. Image acquirer 260 may be configured to perform adjustments of brightness and contrast, etc. of acquired images. In some embodiments, storage 270 may be a storage medium such as a hard disk, flash drive, cloud storage, random access memory (RAM), other types of computer readable memory, and the like. Storage 270 may be coupled with image acquirer 260 and may be used for saving scanned raw image data as original images, and post-processed images. Image acquirer 260 and storage 270 may be connected to controller 50. In some embodiments, image acquirer 260, storage 270, and controller 50 may be integrated together as one control unit.

In some embodiments, image acquirer 260 may acquire one or more images of a sample based on an imaging signal received from detector 206. An imaging signal may correspond to a scanning operation for conducting charged particle imaging. An acquired image may be a single image comprising a plurality of imaging areas. The single image may be stored in storage 270. The single image may be an original image that may be divided into a plurality of regions. Each of the regions may comprise one imaging area containing a feature of wafer 203. The acquired images may comprise multiple images of a single imaging area of wafer 203 sampled multiple times over a time sequence. The multiple images may be stored in storage 270. In some embodiments, image processing system 250 may be configured to perform image processing steps with the multiple images of the same location of wafer 203.

In some embodiments, image processing system 250 may include measurement circuitries (e.g., analog-to-digital converters) to obtain a distribution of the detected secondary electrons. The electron distribution data collected during a detection time window, in combination with corresponding scan path data of primary electron beam 220 incident on the wafer surface, can be used to reconstruct images of the wafer structures under inspection. The reconstructed images can be used to reveal various features of the internal or external structures of wafer 203, and thereby can be used to reveal any defects that may exist in the wafer.

Moreover, although FIG. 2 shows that electron beam tool 40 uses a single primary electron beam, it is appreciated that electron beam tool 40 may also be a multi-beam inspection tool that uses multiple primary electron beams. The present disclosure does not limit the number of primary electron beams used in electron beam tool 40.

Figure 3:
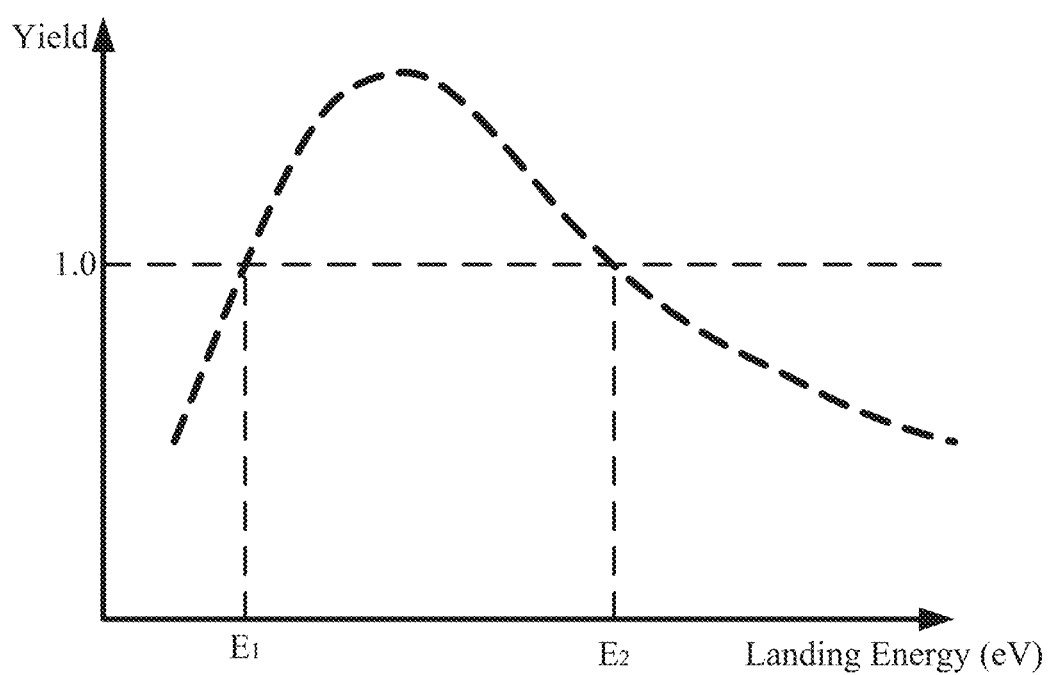
FIG. 3 is an exemplary graph showing a yield of secondary electrons relative to landing energy of primary electrons.

Reference is now made to FIG. 3, which is an exemplary graph showing a yield rate of secondary electrons relative to landing energy of primary electrons. The graph illustrates the relationship of the landing energy of a primary electron beam (such as primary electron beam 220 of FIG. 2) and the yield rate of secondary electron beams (such as secondary electron beams 230 of FIG. 2). The yield rate indicates how many secondary electrons are produced in response to the impact of the primary electrons. For example, the yield rate of higher than 1.0 indicates that a larger amount of secondary electrons may be produced than the amount of primary electrons that have landed on the wafer. Similarly, the yield rate of lower than 1.0 indicates that a lesser amount of secondary electrons may be produced in response to the impact of the primary electrons.

As shown in the graph of FIG. 3, when the landing energy of the primary electrons is within a range from E1 to E2, more electrons may leave the surface of the wafer than have landed onto the surface, therefore resulting in a positive electrical potential at the surface of the wafer. In some embodiments, defect inspection may be performed in the foregoing range of landing energies, which is called "positive mode." As described in further detail with respect to FIG. 4, a device structure with more positive surface potential may produce a darker voltage contrast image because a detector (such as detector 206 of FIG. 2) may receive a lesser amount of secondary electrons.

When the landing energy is lower than E1 or higher than E2, a lesser amount of electrons may leave the surface, thereby resulting in a negative electrical potential at the surface. In some embodiments, a defect inspection may be performed in this range of the landing energy, which is called "negative mode." A device structure with more negative surface potential may produce a brighter voltage contrast image of a wafer.

In some embodiments, the landing energy of the primary electron beams may be controlled by the total bias between the electron gun and the wafer.

Figure 4:
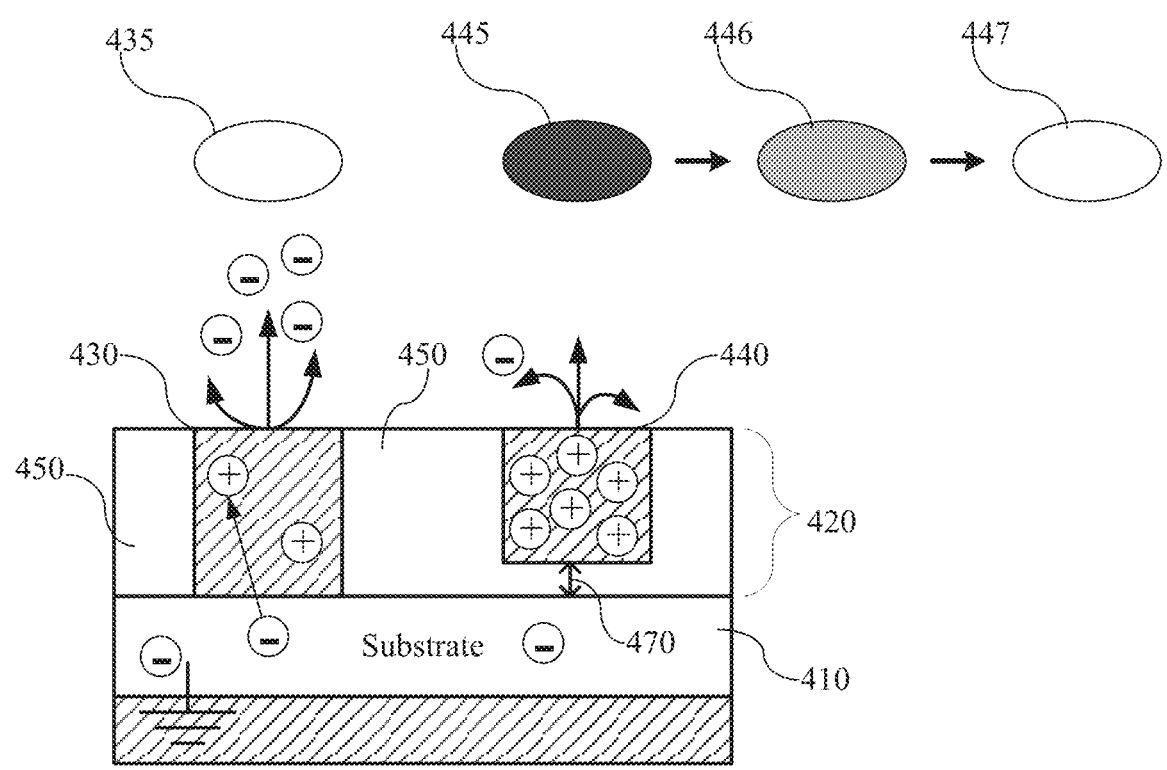
FIG. 4 is a schematic diagram of illustrating voltage-contrast response of a wafer.

Reference is now made to FIG. 4, which is a schematic diagram illustrating voltage contrast response of a device structure of a wafer. In some embodiments, physical and electrical defects in a wafer can be detected using a voltage contrast method of a charged particle inspection system. To detect a defect using voltage contrast images, typically a process called pre-charging is employed in which charged particles are applied onto an area to be inspected before conducting the inspection.

In some embodiments, electron beam tools may be used to detect defects in internal or external structures of a wafer (such as wafer 203 of FIG. 2) based on the voltage contrast response of the wafer to illumination by the primary electron beams. In some embodiments, the wafer may comprise a test device 420 which is developed on top of a substrate 410. In some embodiments, test device 420 may include multiple device structures 430 and 440 separated by insulating material 450. For example, device structure 430 is connected to substrate 410. In contrast, device structure 440 is separated by insulating material 450 that creates a thin insulator structure 470 between device structure 440 and substrate 410 (e.g., thin oxide).

When an electron beam tool (such as electron beam tool 40 of FIG. 2) scans the surface of test device 420 with primary electrons (such as primary electron beam 220 of FIG. 2), secondary electrons (such as secondary electron beam 230 of FIG. 2) may be generated from the surface. As described earlier in FIG. 2, when the landing energy of the primary electrons is within a range from E1 to E2 (such that the yield rate is higher than 1.0), more electrons may leave the surface of the wafer than have landed on the surface, thereby resulting in a positive electrical potential at the surface of the wafer.

FIG. 4 illustrates how positive electrical potentials may be built-up at the surface of a wafer. For example, after an electron beam scans test device 420 (e.g., during pre-charging stage), device structure 440 may retain more positive charges because device structure 440 is not connected to an electrical ground in the substrate, thereby resulting in a positive potential at the surface of device structure 440. In contrast, although primary electrons with the same landing energy (thus, resulting in the same yield rate) have been applied, device structure 430 may retain less positive charges because the built-up positive charges may be neutralized by extra electrons supplied via the connection with substrate 410.

An image processing system (such as image processing system 250 of FIG. 2) may generate voltage contrast images 435 and 445 of the corresponding device structures 430 and 440, respectively. For example, device structure 430 is shorted to the ground and may not retain the built-up positive charges. As such, when the primary electron beams land on the surface of the wafer during the inspection stage, device structure 430 may repel more secondary electrons, thereby resulting in a brighter region on the voltage-contrast image. In contrast, device structure 440 has no connection to the substrate or any other grounds, and therefore may retain the built-up positive charges, which may cause device structure 440 to repel less secondary electrons during the inspection stage, thereby resulting in a darker region on the voltage-contrast image.

A conventional defect inspection tool uses electrons to build up the electrical potential on the surface of a wafer during the pre-charging stage. After pre-charging, the inspection tool obtains images of multiple dies within the wafer. Because all dies may comprise identical device structures, defects can be detected by comparing the voltage contrast differences of these images from multiple dies. For example, if the voltage contrast level of one of the images is lower or higher than the other images, the corresponding die can be determined to have a defect where the mismatch is present. A conventional inspection technique assumes that the electrical surface potential built-up during the pre-charging stage would be retained throughout the inspection stage, and stays above the detection threshold of the electron beam tool.

However, as the semiconductor process technology node shrinks (e.g., 10 nm, 7 nm, and lower), the built-up surface potential level may change during the inspection stage due to effects of electrical breakdown or tunneling, thereby resulting in the failure to detect the thin device defects. When a sufficiently high voltage is applied to a high resistance thin device structure (e.g., thin oxide), such as insulator structure 470, the leakage current may flow through the high resistance structure, thereby preventing the structure from functioning as a perfect insulator. This may affect the circuit functionality and result in a defect. The similar leakage current effect may also occur through a structure with improperly formed materials or high resistance metal layer, for example a cobalt silicide (e.g., CoSi, CoSi2, Co2Si, Co3Si, and such like) layer between a tungsten (W) plug and a source or drain area of a field-effect transistor (FET).

In FIG. 4, insulator structure 470 may represent a thin defect susceptible to such a breakdown effect. For example, because of a manufacturing error, insulator structure 470 may have been defectively created in device structure 440 even though both device structures 430 and 440 are designed to make a contact with substrate 410 and function identically. A defective etching process may leave a thin oxide resulting an unwanted electrical blockage (e.g., open circuit) between two structures (e.g., device structure 440 and substrate 410) which were supposed to be electrically connected.

In such a case, if insulator structure 470 is sufficiently thick (e.g., thicker than 10 nm), the positive charges built-up in device structure 440 would not be leaked through insulator structure 470, therefore a conventional defect inspection tool may be able to detect the defect by taking one sample image during an inspection stage and comparing the image to a reference image. As a result, the voltage contrast difference between 435 and 445 may be detected, and thereby indicate a defect (e.g., insulator structure 470) in device structure 440.

However, as insulator structure 470 gets thinner (e g., thinner than 10 nm), there is a higher chance that the built-up positive surface potential level in device structure 440 may decrease over time due to the above described leakage current. As device structure 440 loses positive charge, the voltage contrast level may also change over time from darker (e.g., image 445) to lighter (e.g., image 446), and eventually the inspection tool may fail to detect anything because the voltage contrast level is lower than the threshold of the detector (e.g., image 447). As a result, by the time the inspection stage begins and the inspection tool starts sampling the voltage contrast images, the built-up positive potential in device structure 440 may all disappear due to the leakage current through the thin insulator structure 470, thereby resulting in no difference in the surface potential between device structure 430 and 440. In such a case, the conventional defect inspection tool may fail to detect the thin device defect reliably if the inspection tool samples an image after the positive charges all disappear. For example, the inspection tool may fail to detect any difference between voltage contrast image 435 (from device structure 430) and voltage contrast image 447 (from device structure 440).

Therefore, to detect thin device defects susceptible to the time-dependent change of the built-up surface potential described above, an inspection tool may sample multiple images of the wafer over one or more time sequences while gradually increasing the surface potential, so that the time-dependent change may be captured by the sequence of multiple images. Additionally, in some embodiments, the inspection tool may use low energy primary electrons to gradually charge the wafer without inducing such a breakdown effect during the pre-charging stage. In other embodiments, the inspection tool may sample and produce voltage contrast images while pre-charging is in progress, so that a transient voltage contrast change can be captured even during the pre-charging stage.

The foregoing description has described the existence of short circuit conditions resulting in the corresponding features appearing bright, and the existence of open circuit conditions resulting in the corresponding features appearing dark. However, it is appreciated to those skilled in the art that the bright and dark appearance may be changed and even reversed depending on the actual processing of the test structures or the setting of the electron beam tool.

Figure 5A:
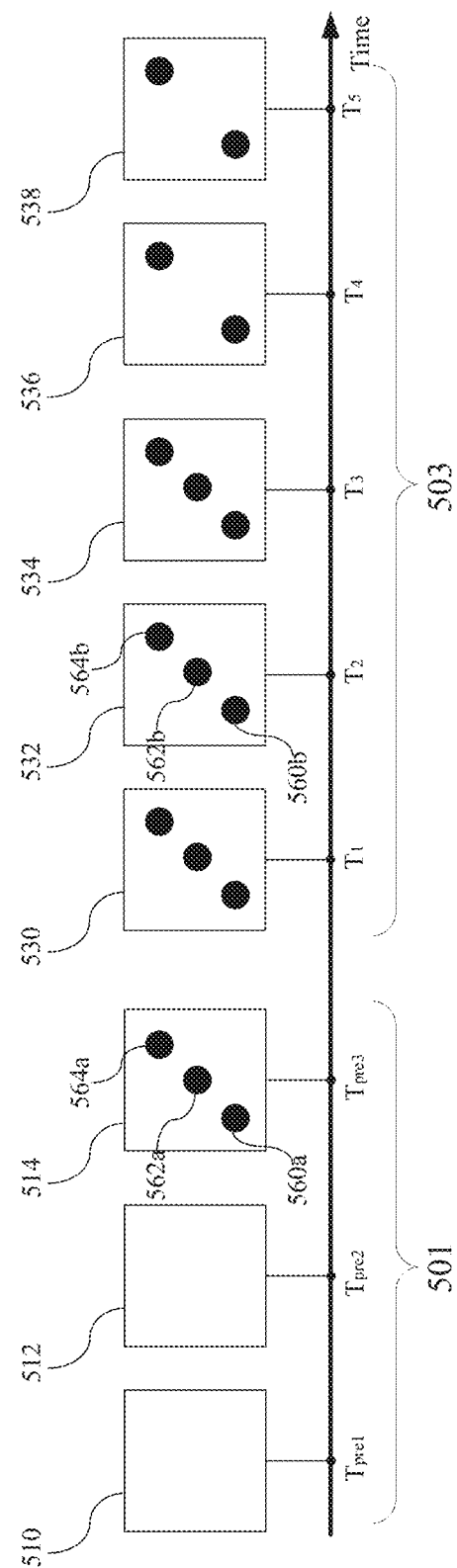
FIGS. 5A and 5B are illustrations of exemplary voltage contrast images over a time sequence, consistent with embodiments of the present disclosure.

Reference is now made to FIG. 5A, which is an illustration of exemplary voltage contrast images over a time sequence, consistent with embodiments of the present disclosure. In some embodiments, a defect inspection process may include a pre-charging stage 501 and an inspection stage 503. During pre-charging stage 501, an imaging system (such as imaging system 200 in FIG. 2) uses electrons to build up the electrical potential on the surface of a wafer. As explained above, to detect a thin device defect, the imaging system may use low energy electrons to gradually build up the electrical surface potential without inducing a breakdown or tunneling while pre-charging is underway. During inspection stage 503, in some embodiments, the imaging system may sample multiple images of a location area of a wafer (such as wafer 203 in FIG. 2) over a time sequence. By comparing the multiple voltage contrast images of the same location but from different times, the system may detect a change of the electrical surface potential over time, which indicates a device breakdown or tunneling effect due to a thin device defect.

For example, as shown in FIG. 5A, at the beginning of pre-charging stage 501, the surface potential may not be high enough to show any detectable voltage contrast regions, as shown in voltage contrast images 510 and 512. At the end of the pre-charging stage, dark voltage contrast (DVC) regions 560a, 562a, and 564a may start appearing (e.g., at time at time Tpre3).

In some embodiments, during pre-charging stage 501, an electron beam tool (such as electron beam tool 40 in FIG. 2) may use primary electrons with lower energy than the conventional system to avoid a device breakdown during the pre-charging stage (e.g., before the sampling of voltage contrast images begins), as explained above.

In other embodiments, the electron beam tool may skip pre-charging stage 501 and begin the inspection process with inspection stage 503 to detect a thin device structure defect. In such embodiments, the electron beam tool may begin sampling images as soon as the inspection process is initiated. Because there is no pre-charging of the electrical potential at the surface of the wafer, the primary beam scanning for image production may be used to gradually build electrical charges at the surface of the wafer while continuously sampling images.

After the pre-charging is completed, the electron beam tool may start sampling images from an area of the wafer multiple times over a time sequence. For example, as shown in FIG. 5A, multiple images 530, 532, 534, 536, and 538 are sampled during the inspection stage at time T1, T2, T3, T4, and T5, respectively.

At time T1, image 530 shows that three DVC regions 560a, 562a, and 564a are present. DVC regions 560b, 562b, and 564b may represent the electrical surface potential built-up in three device structures (such as device structure 440 of FIG. 4). At time T2 and T3, image 532 and 534 show that DVC regions 560b, 562b, and 564b are detected again, which may indicate that the built-up positive charges are remained in the device structure and unchanged from time T1.

At time T4, image 536 shows that DVC region 562b disappears while DVC regions 560b and 564b are still present. This may indicate that the corresponding device structure for DVC region 562b may have lost the built-up positive charges due to the leakage current, thereby resulting in the surface potential dropping down to a non-detectable level (e.g., breakdown effect). When a high voltage is applied to a thin structure (e.g., insulator structure 470 of FIG. 4), leakage current may flow through the thin structure even if the structure is made of an insulating material. The rate of the leakage current is higher when the device structure is thinner. For example, the device breakdown may occur more frequently if the thickness of device structure is, e.g., less than 10 nm. Therefore, the positive charge built-up at the corresponding device structure for DVC region 562b may have been neutralized because of the device breakdown through the thin device structure defect.

Figure 5B:
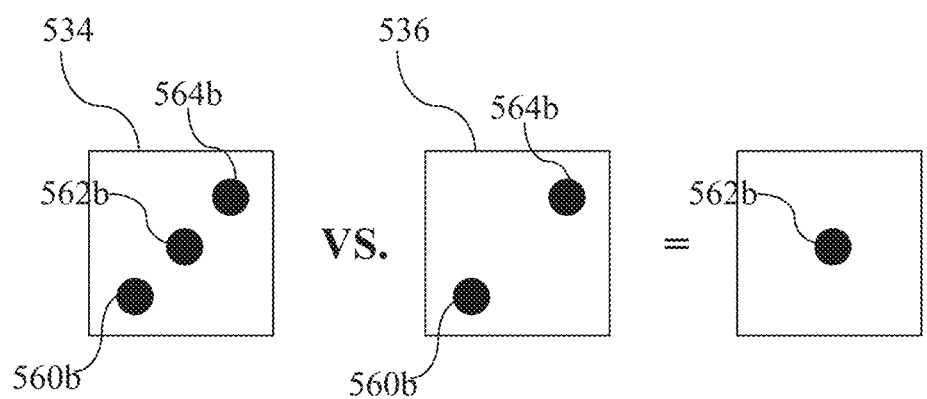

In some embodiments, a thin device structure defect may be identified by detecting this transient effect on the surface potential. For example, an electron beam tool may compare multiple images of the same location, e.g., images 530, 532, 534, 536, and 538, and detect the changes of DVC regions over a time sequence to identify a thin device structure defect. In some embodiments, by comparing the multiple voltage contrast images of the same location but from different times, the system may detect a change of the electrical surface potential over time, which indicates a device breakdown due to a thin device defect. For example, as shown in FIG. 5B, voltage contrast image 534 (sampled at time T3) and 536 (sampled at time T4) show that DVC region 562b has disappeared between time T3 and T4, and thereby may indicate that the corresponding device structure may comprise a thin device structure defect.

Although FIG. 5A illustrates an example with five images, it is appreciated that two or more images may be used to detect the thin device structure defect. Furthermore, although images shown in FIGS. 5A and 5B illustrate the detection mechanism using the dark voltage contrast, it is appreciated that the bright voltage contrast may also be used when the electron beam tool operates in the negative mode.

In some embodiments, a positive surface potential may be built up because the electron beam tool operates in the positive mode (e.g., E1<Landing Energy<E2). In other embodiments, a negative potential may be built up because the electron beam tool operates in the negative mode (e.g., Landing Energy<E1 or Landing Energy>E2).

Figure 6A:
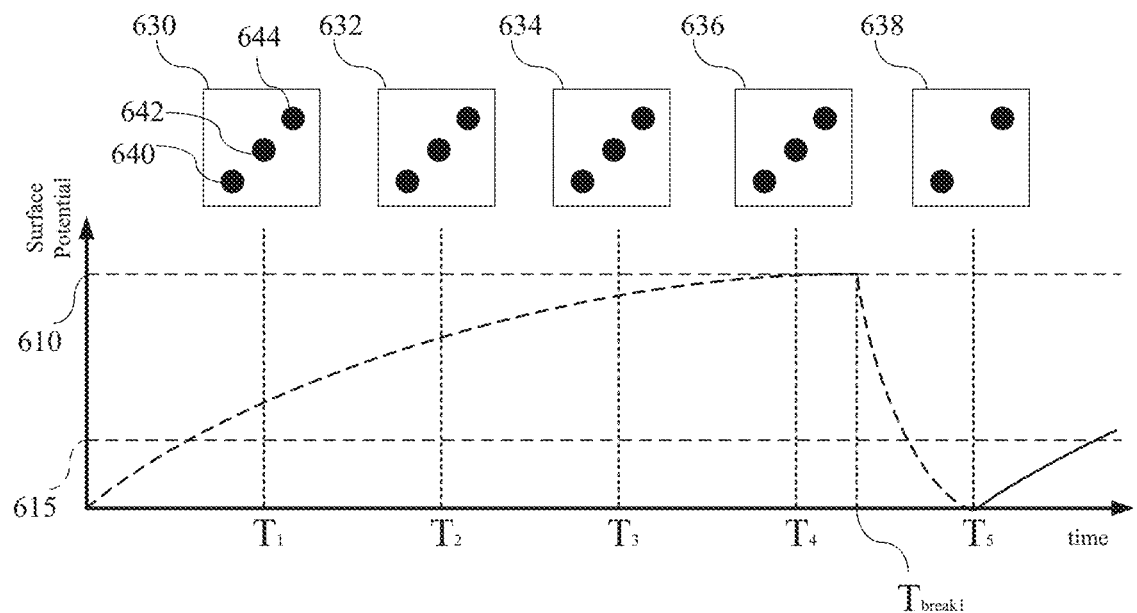
FIGS. 6A, 6B, and 6C are illustrations of exemplary voltage contrast images in relation to surface potential change over a time sequence, consistent with embodiments of the present disclosure.
Figure 6B:
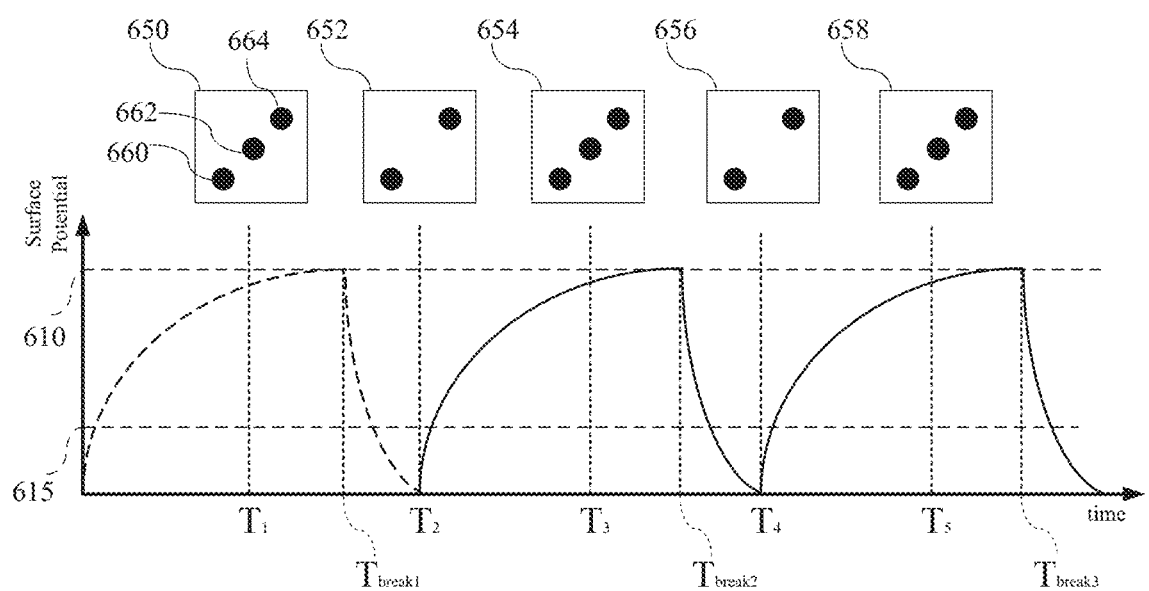
Figure 6C:
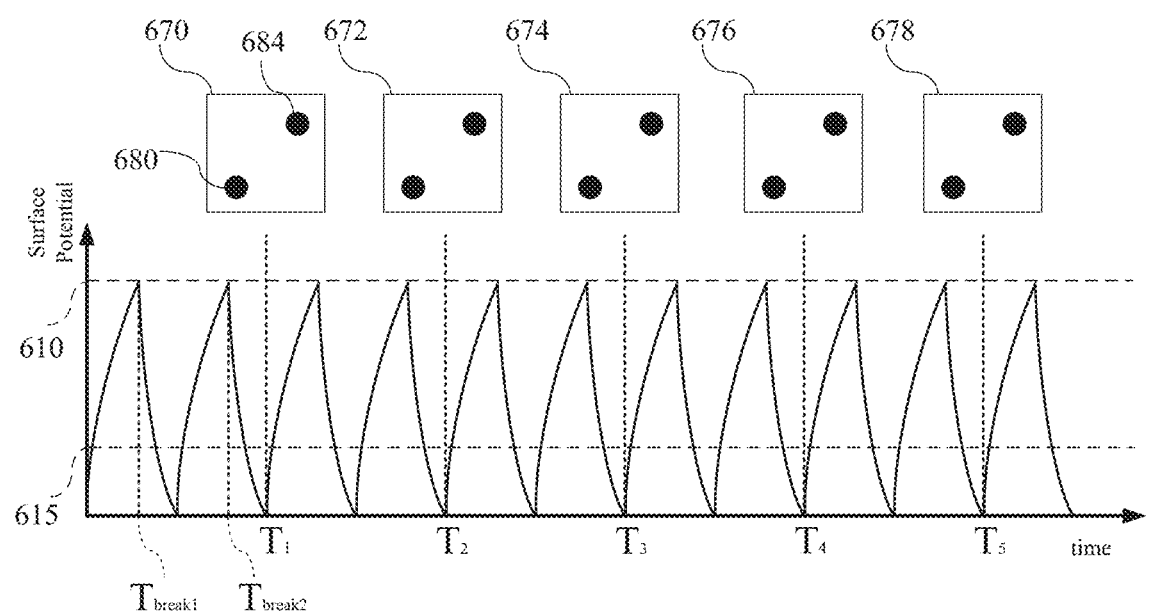

Reference is now made to FIGS. 6A, 6B, and 6C, which are illustrations of exemplary voltage contrast images in relation to surface potential change over a time sequence, consistent with embodiments of the present disclosure.

FIG. 6A illustrates a temporal characteristic of a defect in a slow-charging device structure. During the inspection period, an electron beam tool (such as electron beam tool 40 of FIG. 2) may continuously scan the wafer with electron beams. This continuous scanning may result in accumulation of positive charges in a device structure (such as device structure 440 of FIG. 4). For the slow-charging device structure, this charge accumulation progress slowly, and therefore the surface potential slowly increases over a long period as shown in FIG. 6A. For example, in FIG. 6A, the surface potential gradually increases from time zero to time T4, and the first breakdown does not occur until time Tbreak1. Because the surface potential levels at time T1, T2, T3, and T4 are higher than a threshold voltage 615 of a detector (such as electron detector 206 of FIG. 2), three DVC regions 640, 642, and 644 may appear on voltage contrast images 630, 632, 634, and 636 (sampled at time T1, T2, T3, and T4, respectively). However, after the breakdown at time Tbreak1, the surface potential drops down to approximately zero (thus lower than threshold voltage 615) at time T5, thereby causing DVC region 642 to disappear on voltage contrast image 638 (sampled at time T5). As a result, the electron beam tool may identify the defect by comparing image 638 against images 630, 632, 634, and 636.

FIG. 6B illustrates a temporal characteristic of another slow-charging device structure. The surface potential in FIG. 6B increases faster than FIG. 6A, therefore the breakdown occurs more quickly. However, because the time between the consecutive breakdowns (e.g., from Tbreak1 to Tbreak2) is longer than the sampling period (e.g., from T1 to T2), the defect can still be reliably detected when multiple images are compared. For example, images 650, 654, and 658 shows three DVC regions 660, 662, and 664 because those images are sampled at T1, T3, and T5, when the surface potential levels are higher than threshold 615. Images 652 and 656 do not show DVC region 662 because images 652 and 656 are sampled at T2 and T4, when the surface potential drops lower than threshold 615 after the breakdowns at Tbreak1 and Tbreak2. Therefore, the electron beam tool may be able to identify the defect by comparing images 652 and 656 against images 650, 654, and 658.

In contrast, FIG. 6C illustrates a temporal characteristic of a defect in a very fast-charging device structure. As shown in the graph of FIG. 6C, the surface charges may accumulate very fast in this device structure, and accordingly breakdowns may occur much more frequently. The period between the consecutive breakdowns (e.g., from Tbreak1 to Tbreak2) is shorter than the sampling period (e.g., from T1 to T2). This fast breakdown behavior prevents the electron beam tool from reliably detecting the defect in the fast-charging device structure. For example, in FIG. 6C, all five images 670, 672, 674, 676, and 678 are sampled at right after breakdowns when the surface potential levels are lower than detector threshold 615. Accordingly, only two DVC regions 680 and 684 may appear in those five images. Therefore, the electron beam tool may not be able to identify the defect in the fast-charging device structure.

One way to improve detection reliability for the defect in the fast-charging device structure is to increase the image sampling rate (e.g., reduce the sampling period between images). However, conventional electron beam tools often are limited with increasing sampling rate due to the mechanics of the conventional scanning sequence as illustrated in FIG. 7.

Figure 7:
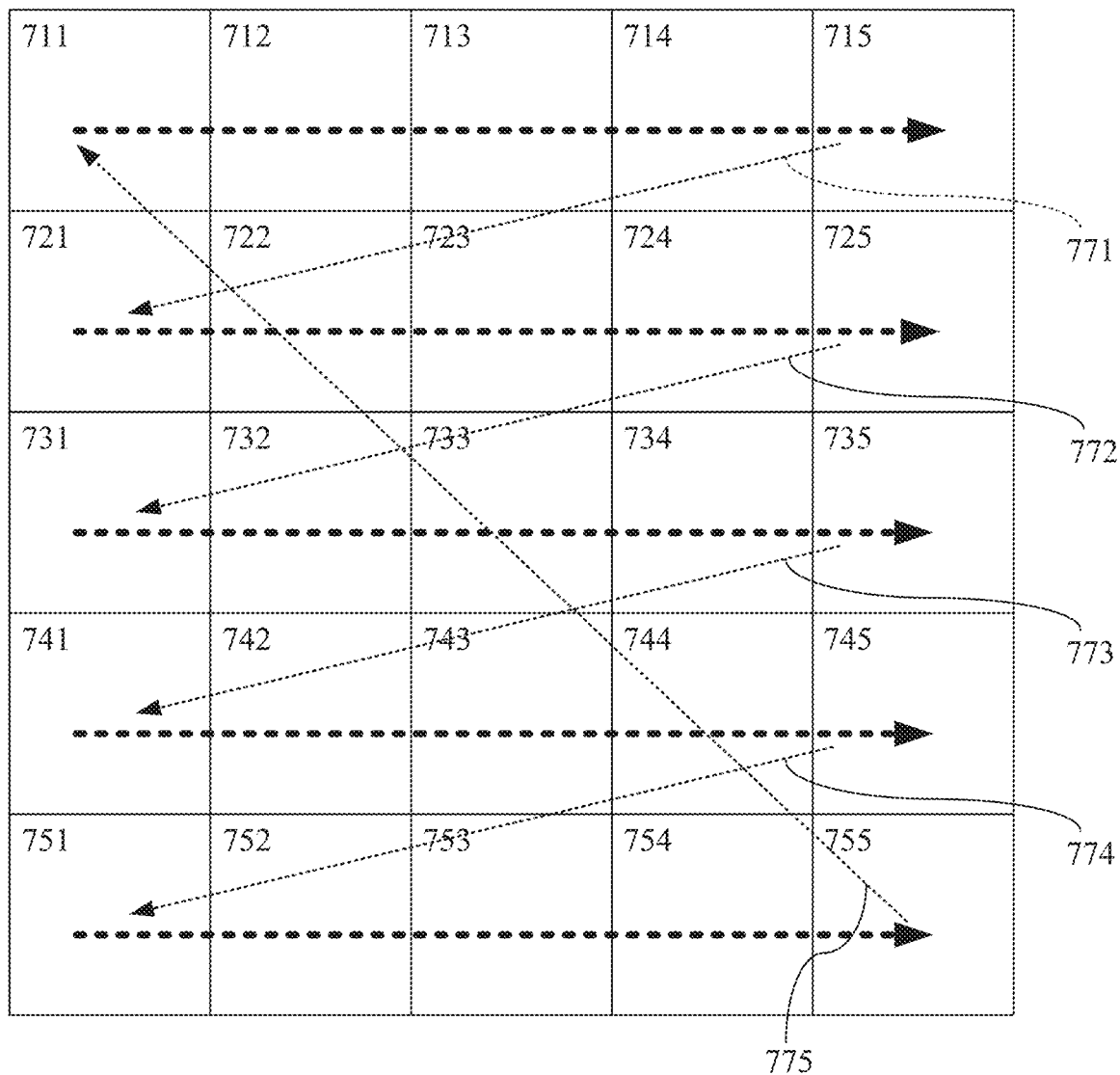
FIG. 7 is an illustration of a conventional scanning sequence.

Reference is now made to FIG. 7, is an illustration of a conventional scanning sequence. A conventional electron beam tool often generates images by raster scanning an electron beam over a wafer sample. FIG. 7 shows an exemplary sequence of raster scanning to generate a five-by-five-pixel image. In raster scanning, the electron beam moves horizontally at a steady rate from left to right (e.g., from pixel 711 to pixel 715) to scan a row (or line) of pixels (e.g., pixels 711, 712, 713, 714, and 715) across the wafer. Once the electron beam reaches the last pixel (e.g., pixel 715) of the row being scanned, the beam rapidly moves back to the first pixel of the next row (e.g., 721), where scanning of the next row may start. These steps may be repeated until the last row (e.g., the row with pixels 751, 752, 753, 754, and 755) is scanned. At that point, the electron beam may move back to the first pixel of the first row (e.g., pixel 711) to start scanning the area again to generate another image. Alternatively, the electron beam may be repositioned to a different location, where scanning of a different area of the wafer may start.

The step of moving the electron beam rapidly from one position to another position without actual scanning is called a retrace. For example, FIG. 7 illustrates retraces 771, 772, 773, 774, and 775. Moving the electron beam from the last pixel in one row to the first pixel in the next row (e.g., retrace 771, 772, 773, or 774) is called a horizontal retrace. Moving the electron beam from the last row to the first row (e.g., retrace 775) is called a vertical retrace. The extra time required for retrace is called a line overhead.

In raster scanning, the images are generated sequentially (i.e., the second image scanning may not start until the first image scanning is completed). Thus, the speed of sampling multiple images back-to-back may be determined by the time required to scan the whole area. For example, the minimum time required to scan the whole area (a five-by-five-pixel area) in FIG. 7 may be represented as 25tp+4thr+tvr, because all twenty-five pixels should be scanned, where tp represents time required to scan one pixel; thr represents the line overhead of each horizontal retrace; and tvr represents the line overhead of each vertical retrace.

Therefore, at best, the electron beam tool using the conventional raster scanning may be limited to generate images every 25tp+4thr+tvr. For example, after scanning pixel 711, the electron beam may not be able to come back to pixel 711 again until all the remaining twenty-four pixels are scanned, which is 25tp+4thr+tvr later. This means the time difference between the scanning of two consecutive images for the same pixel is 25tp+4thr+tvr. As explained in FIG. 6C, if breakdowns in a fast-charging device structure occur more frequently than 25tp+4thr+tvr, the conventional electron beam tool may not reliably detect the defect in the fast-charging structure.

Figure 8A:
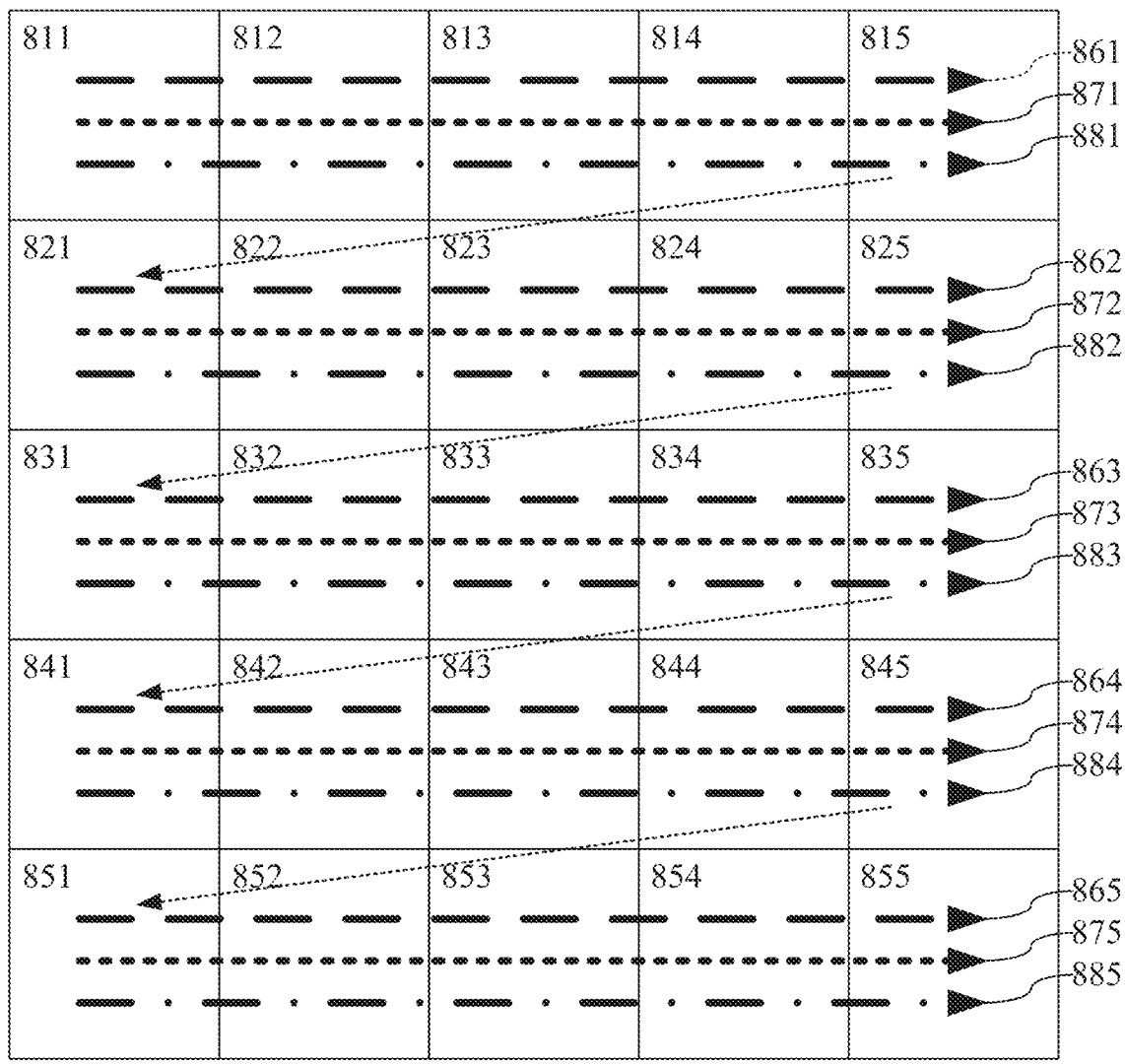
FIGS. 8A and 8B are illustrations of an exemplary scanning sequence, consistent with embodiments of the present disclosure.
Figure 8B:
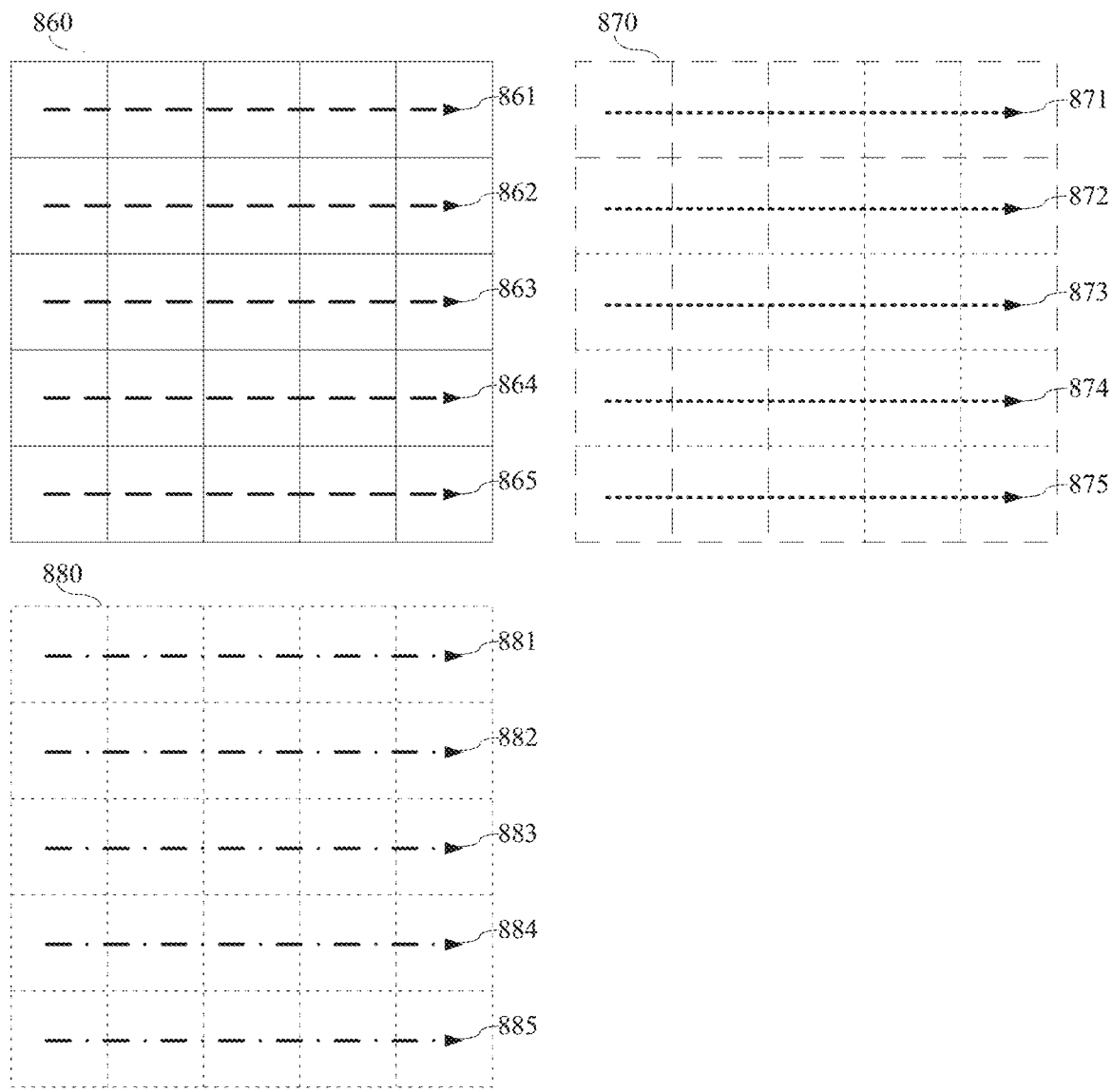

Reference is now made to FIGS. 8A and 8B, which are illustrations of an exemplary scanning sequence, consistent with embodiments of the present disclosure. In some embodiments, images may be generated more frequently if an electron beam tool (such as electron beam tool 40 of FIG. 2) may scan each row multiple times before moving to the next row. For example, as shown in FIG. 8A, the electron beam may scan the first row (e.g., the row with pixels 811, 812, 813, 814, and 815) three times (e.g., scan 861, 871, and 881), and then move to pixel 821 to scan the next row.

After completing scanning all five rows, three times each, an image processing system (such as image processing system 250 of FIG. 2) may reconstruct three images, as shown in FIG. 8B, by reassembling scan data produced during each scan. For example, an image 860 may include scanning data from each of the first scan (861, 862, 863, 864, and 865) of the rows. An image 870 may include scanning data from each of the second scan (871, 872, 873, 874, and 875) of the rows. An image 880 may include scanning data from each of the third scan (881, 882, 883, 884, and 885) of the rows.

As the scanning is performed on a per row basis, in such embodiments, the electron beam may be able to come back to the same pixel much quicker than the conventional raster scanning shown in FIG. 7. For example, after scanning pixel 811 via scan 861, the electron beam may be able to come back to pixel 811 and produce image data again, via scan 871, after just 5tp+thr. Therefore, time gap between the same pixel in the consecutive images, such as the first pixel in image 860 and the first pixel in image 870, may be 5tp+thr, which is much shorter than 25tp+4thr+tvr in the conventional raster scanning shown in FIG. 7, assuming that tp and thr in such embodiments stay the same as in the conventional raster scanning. As a result, an electron beam tool using such embodiments may be able to better detect a time-dependent defect in a fast-charging device structure.

Figure 9A:
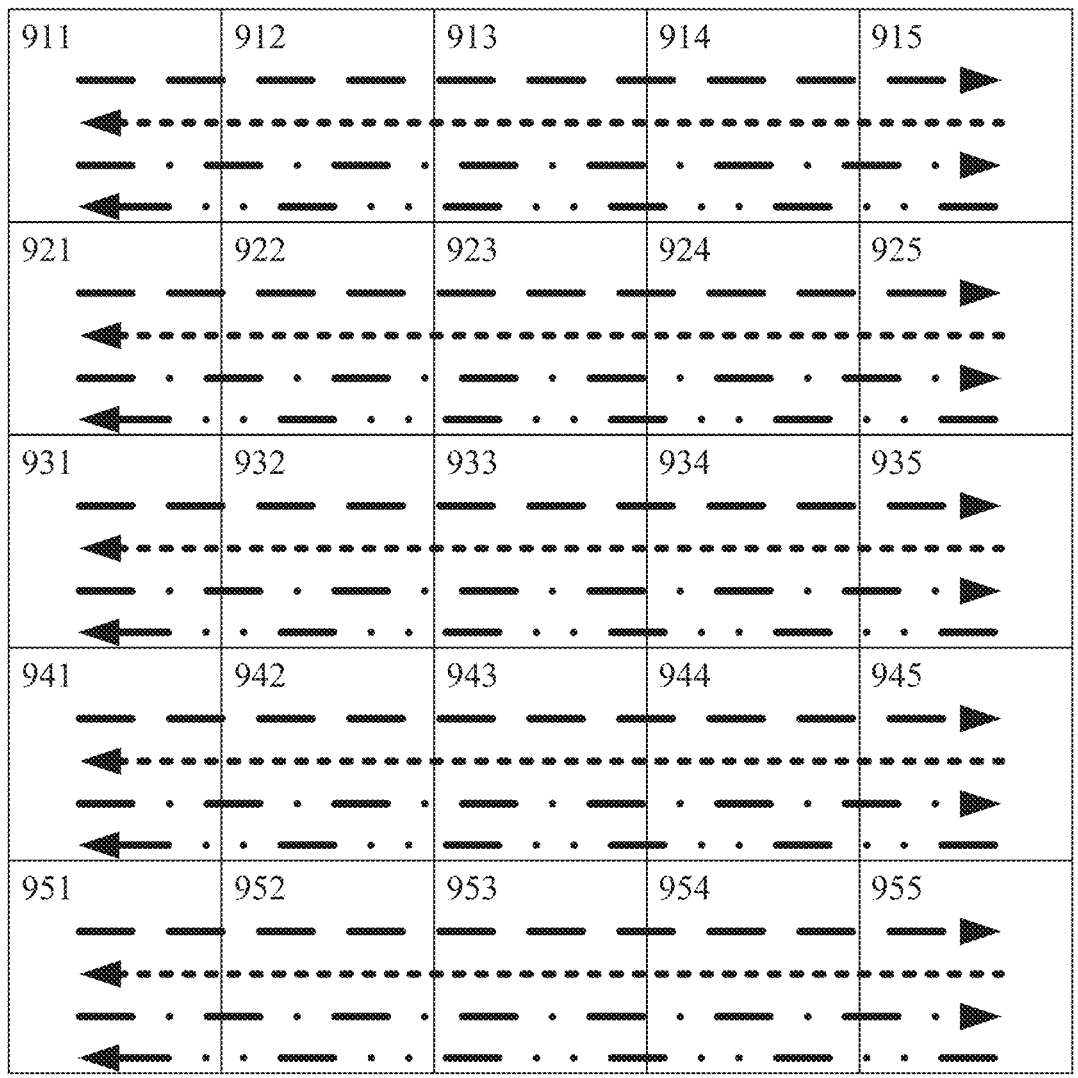
FIGS. 9A, 9B, 9C, and 9D are illustrations of an exemplary scanning sequence, consistent with embodiments of the present disclosure.

Reference is now made to FIGS. 9A, 9B, 9C, and 9D which are illustrations of an exemplary scanning sequence, consistent with embodiments of the present disclosure. In some embodiments, the electron beam tool may perform bidirectional scanning. For example, as shown in FIG. 9A, the electron beam may scan the first row (e.g., the row with pixels 911, 912, 913, 914, and 915) four times in alternating directions (e.g., changing the scanning direction every time). In such embodiments, the horizontal retrace step in between each scanning (and the corresponding time thr) may be eliminated, thereby resulting in improvement of overall throughput of the inspection system.

Additionally, in some embodiments, bidirectional scanning may improve balance among pixels in which positive charges accumulate through scanning of primary electron beams. Unbalance among pixels occurs because the electron beam often influences the current pixel under scan as well as the next pixel in the direction of scanning Thus, unidirectional scanning may create unbalanced charging towards the direction of scanning. In some embodiments, bidirectional scanning may improve the overall balance among the pixels in each row.

Figure 9B:
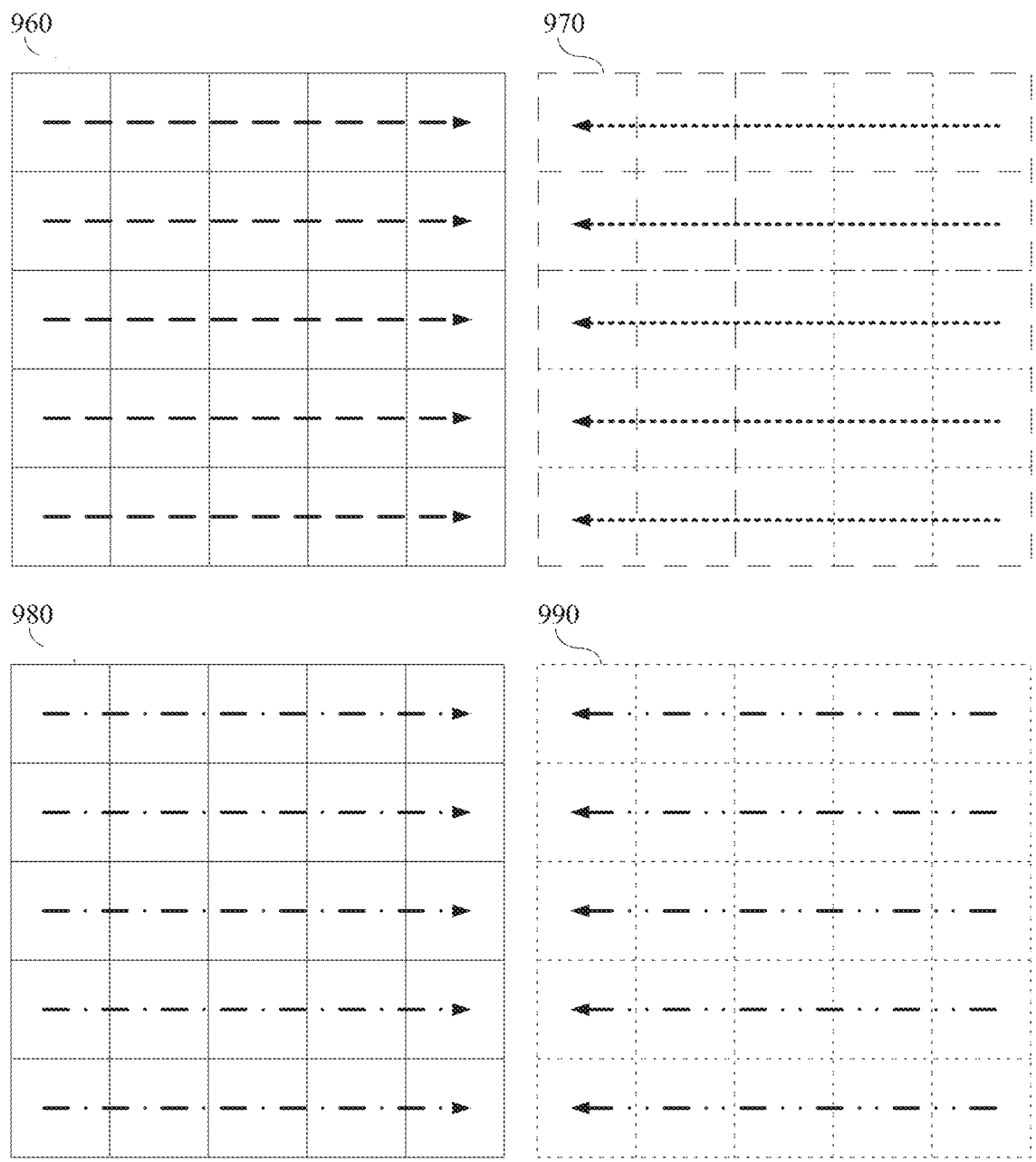

Image reconstruction may be performed in a similar way described above in FIG. 8B. After completing scanning of all five rows, in some embodiments, an image processing system (such as image processing system 250 of FIG. 2) may reconstruct four images (each corresponding to a scan out of four times of scanning), as shown in FIG. 9B, by reassembling scan data produced during the scanning of each row.

Figure 9C:
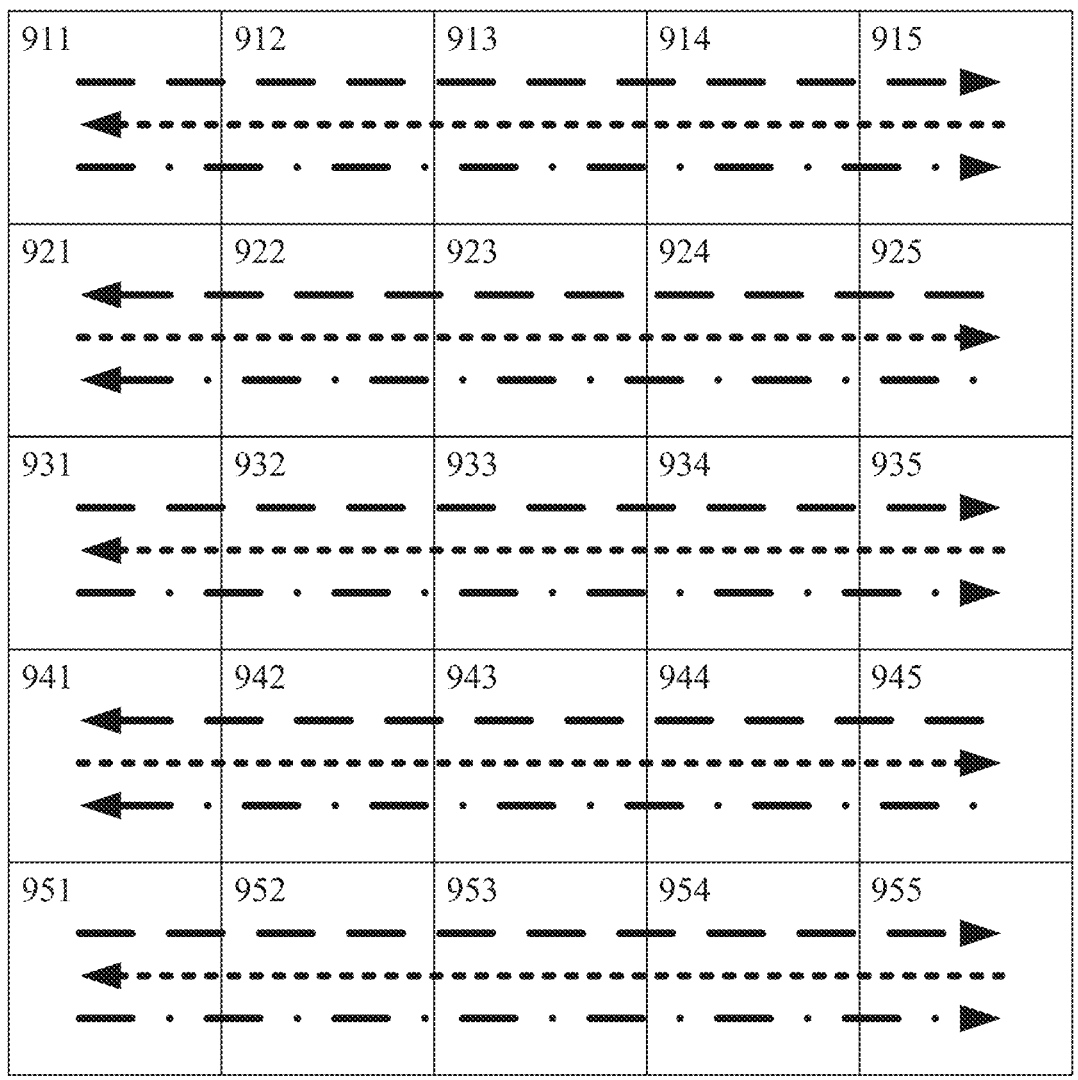

FIG. 9C shows another embodiment of bidirectional scanning sequence. In some embodiments, the electron beam may scan the first row three times in alternating directions. When the scanning of the first row is completed at pixel 915, instead of horizontally retracing back to pixel 921 (the first pixel of the second line), the first scanning of the second row may go the other direction from pixel 925 to pixel 921.

Figure 9D:
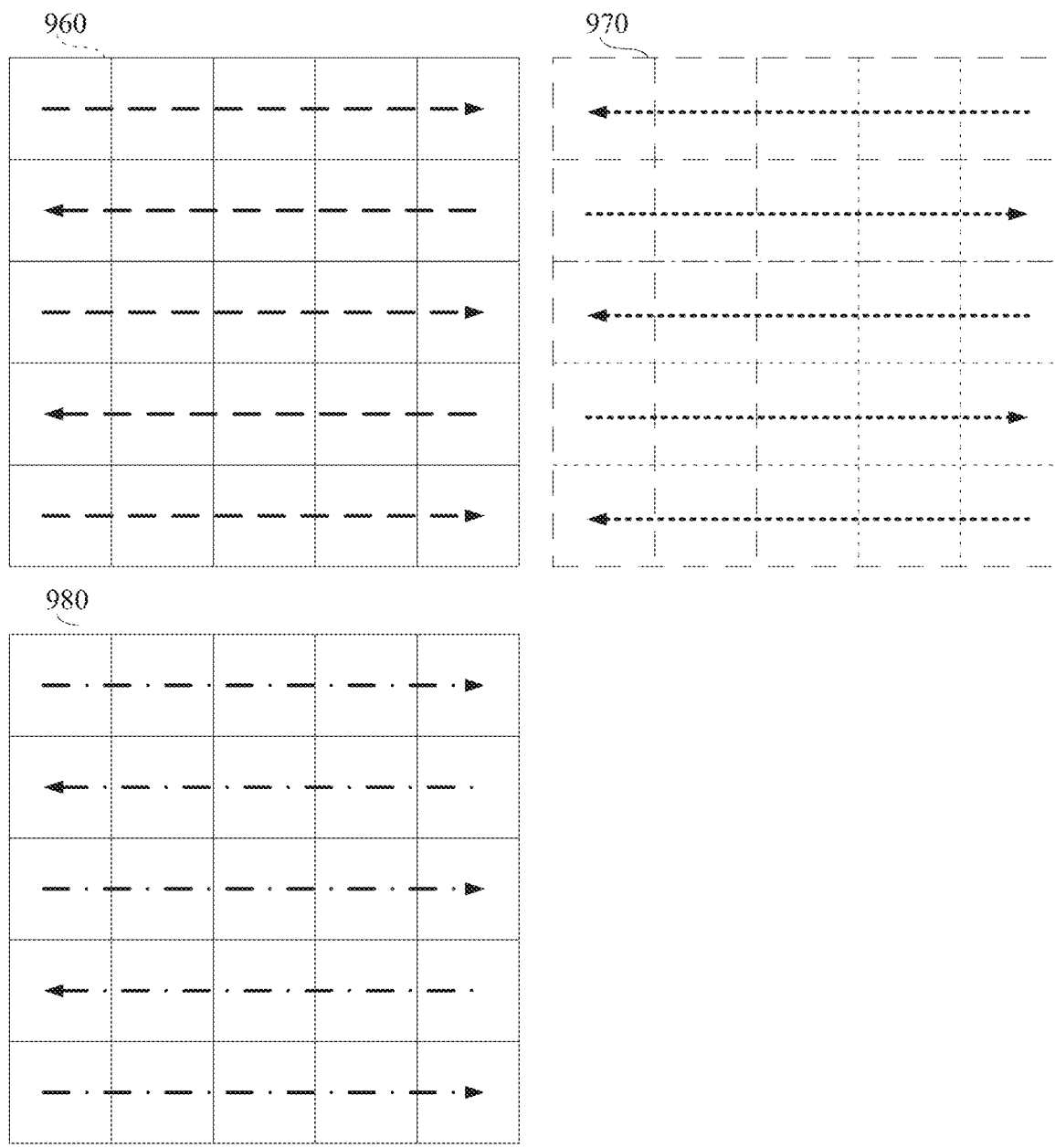

Image reconstruction may be performed similarly. After completing scanning of all five rows, in some embodiments, the image processing system may reconstruct three images as shown in FIG. 9D.

Figure 10A:
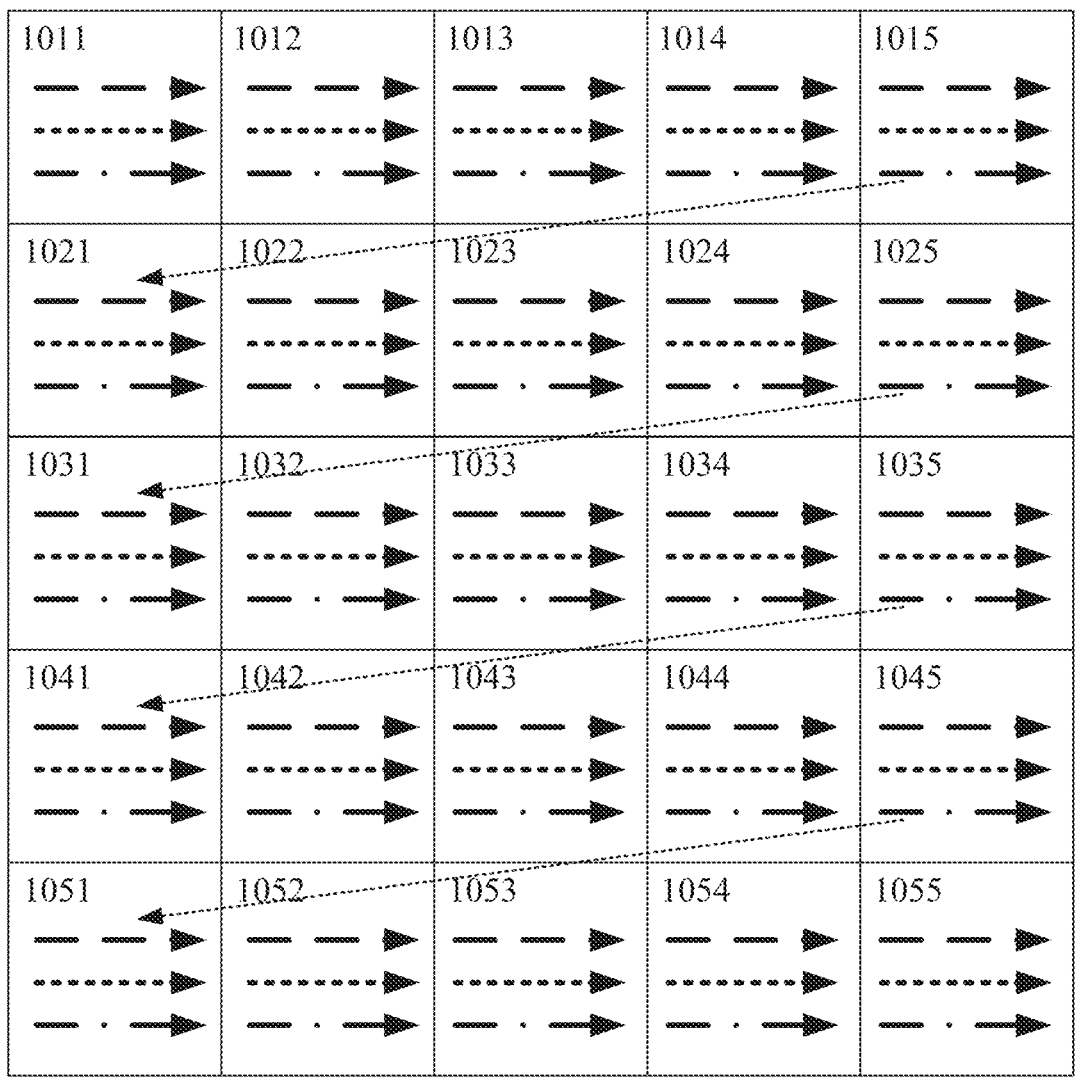
FIGS. 10A and 10B are illustrations of an exemplary scanning sequence, consistent with embodiments of the present disclosure.
Figure 10B:

Reference is now made to FIGS. 10A and 10B which are illustrations of an exemplary scanning sequence, consistent with embodiments of the present disclosure. In some embodiments, the sampling speed of the electron beam tool may be further improved if scanning is performed on a per-pixel basis (i.e., the electron beam may scan each pixel multiple times before moving to the next pixel). For example, as shown in FIG. 9A, the electron beam may scan the first pixel (e.g., pixel 1011) three times before moving to the next pixel (e.g., pixel 1012). After completing the scanning of all pixels in the first row (e.g., pixels 1011, 1012, 1013, 1014, and 1015), the electron beam may retrace horizontally to the next row.

Image reconstruction may be performed in a similar way described above in FIG. 8B. After completing the scanning of all pixels involving each pixel of the five rows getting scanned three times each, in some embodiments, an image processing system (such as image processing system 250 of FIG. 2) may reconstruct three images, as shown in FIG. 10B, by reassembling scan data produced during the scanning of each pixel. For example, an image 1060 may include scanning data from each of the first scans of the pixels. An image 1070 may include scanning data from each of the second scans of the pixels. An image 1080 may include scanning data from each of the third scans of the pixels.

In such embodiment, the electron beam may be able to come back to the same pixel much quicker than the conventional raster scanning shown in FIG. 7. For example, as the same pixel is scanned multiple times before scanning of the next pixel, after scanning pixel 1011, the electron beam may be able to come back to pixel 1011 and produce image data again after just tp. Therefore, time gap between the same pixel in the consecutive images, such as the first pixel in image 1060 and the first pixel in image 1070, may be tp, which is much shorter than 25tp+4thr+tvr in the conventional raster scanning shown in FIG. 7, assuming that tp in such embodiment stays the same as in the conventional raster scanning. As a result, an electron beam tool using such embodiments may be able to detect a time-dependent defect in a very fast-charging device structure.

Figure 11:
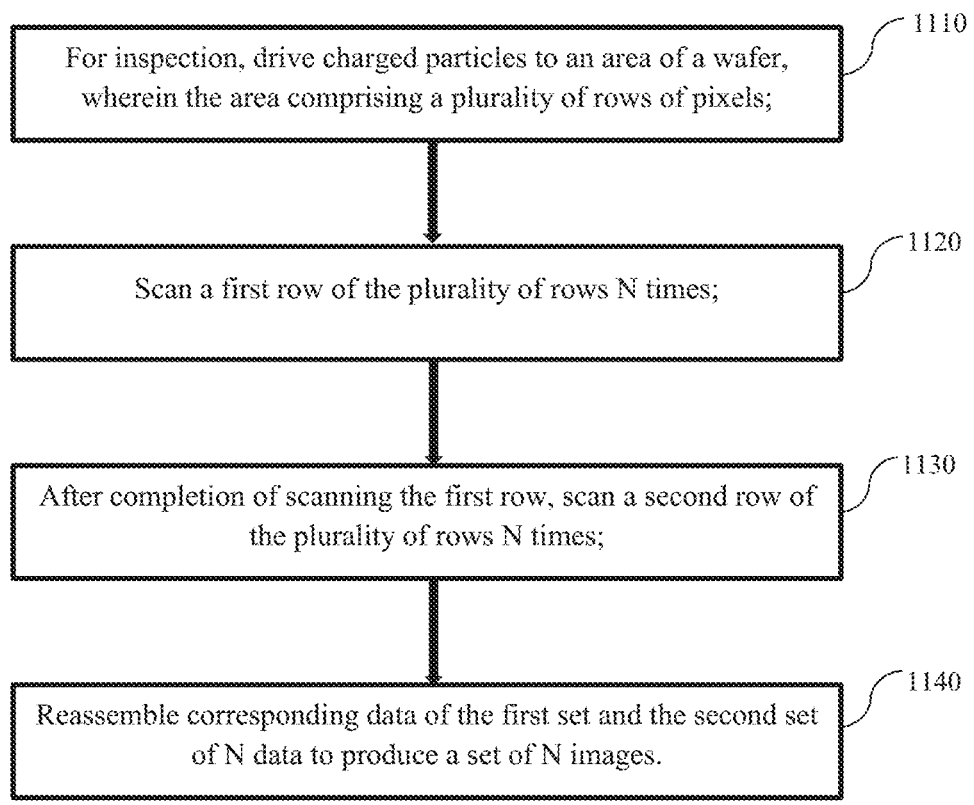
FIG. 11 is a flow chart illustrating an exemplary method for detecting a time-dependent defect, consistent with embodiments of the present disclosure.

Reference is now made to FIG. 11, which is a flow chart illustrating an exemplary method for detecting a time-dependent defect, consistent with embodiments of the present disclosure. The method may be performed by an electron beam tool (such as electron beam tool 40 of FIG. 2) and an image processing system (such as image processing system 250 of FIG. 2).

In step 1110, the electron beam tool delivers an electron beam (such as a primary electron beam 220 of the FIG. 2) to a wafer to scan an area of the wafer. When the electron beam tool scans the surface of a wafer with the primary electrons, secondary electrons (such as secondary electron beams 230 of FIG. 2) may be generated from the surface. During the inspection period, the electron beam tool may continuously scan the wafer with the electron beam. This continuous scanning may result in accumulation of positive charges in a device structure (such as device structure 440 of FIG. 4). For a slow-charging device structure, the surface potential may slowly increase over a long period, and the defect may be detected by sampling and comparing multiple images (such as images 630, 632, 634, 636, and 638 of FIG. 6A). However, for a fast-charging device structure, the surface potential may change much more quickly, resulting in breakdowns occurring much more frequently. Even if multiple images may be obtained, those multiple images (such as images 670, 672, 674, 676, and 678 in FIG. 6C) may be sampled at times when the surface potential levels are lower than a detector threshold (such as threshold 615 in FIG. 6C). Therefore, the electron beam tool may not be able to identify the defect in the fast-charging device structure.

One way to improve detection reliability for the defect in the fast-charging device structure is to increase the image sampling rate (i.e., reduce the sampling period). However, conventional electron beam tools are limited with increasing the sampling rate because of the sequential nature of conventional raster scanning sequences (i.e. the second image scanning cannot start until the first image scanning is completed).

In some embodiments, images may be generated more frequently if the electron beam tool scans each row multiple times before horizontally retracing to the next row.

In step 1120, the electron beam tool scans a first row N times before moving to the next row. In some embodiments, the tool may scan a row repeatedly N times as shown in FIGS. 8A, 9A, and 9C. In some embodiments, the tool may scan a pixel repeatedly N times as shown in FIG. 10A before scanning the next pixel in the row N times.

In step 1130, after completing scanning the first row, the electron beam tool moves the electron beam to the next row and scans the second row N times. The step 1120 and 1130 are repeated until all rows are scanned. In some embodiments, a horizontal retracing may be required to reposition the electron beam at the first pixel of the next row, as shown in FIG. 8A. In other embodiments, the horizontal retracing may be omitted by utilizing bidirectional scanning, as shown in FIGS. 9A and 9C.

In step 1140, after completing the scanning of all rows, an image processing system (such as image processing system 250 of FIG. 2) processes the data collected while scanning the wafer and reassembles corresponding data to reconstruct a set of N images, where N is any integer.

For example, as shown in FIG. 8B, after completing scanning all five rows, three time each, the image processing system reconstructs three images using the data collected during the scanning. For example, image 860 of FIG. 8B includes scanning data from each of the first scan (861, 862, 863, 864, and 865) of the rows. Image 870 of FIG. 8B includes scanning data from each of the second scan (871, 872, 873, 874, and 875) of the rows. Image 880 of FIG. 8B includes scanning data from each of the third scan (881, 882, 883, 884, and 885) of the rows.

Using such a method described above with respect to FIGS. 8A and 8B, the electron beam tool can generate multiple images with shorter time gap between the same pixels in those images. For example, after scanning pixel 811 via scan 861, the electron beam may be able to come back to pixel 811 and produce image data again, via scan 871, after just 5tp+thr, where tp represents time required to scan one pixel; thr represents line overhead of each horizontal retrace; and tvr represents line overhead of vertical retrace. Therefore, the time gap between the same pixel in the consecutive images, such as the first pixel in image 860 and the first pixel in image 870, may be 5tp+thr, which is much shorter than 25tp+4thr+tvr required for the conventional electron beam tool, assuming that tp and thr in such embodiments stay the same as in the conventional electron beam tool.

The embodiments may further be described using the following clauses:

1. A charged particle beam system for inspecting a wafer, comprising:
   a charged particle beam source including circuitry to:
   deliver charged particles to a surface of the wafer over a time sequence; and
   scan an area of the wafer, wherein the area comprises a plurality of rows of pixels; and
   a controller including circuitry to:

produce a set of N images of the area over the time sequence, wherein N is an integer; and compare the set of N images to detect a defect that results in a high resistance structure in the area of the wafer.

2. The system of clause 1, wherein the charged particle beam source includes circuitry to:

scan a first row of the plurality of rows N times, and after completion of scanning the first row, scan a second row of the plurality of rows N times; and wherein the controller includes circuitry to:

produce a first set of N data based on a scan of the first row, produce a second set of N data based on a scan of the second row, and produce the set of N images based on corresponding data of the first set and the second set of N data.

3. The system of clause 2, wherein the charged particle beam source includes circuitry to:

scan the first row N times in alternate directions each time, and scan the second row N times in alternate directions each time.

4. The system of clause 1, wherein the charged particle beam source includes circuitry to:

scan a first pixel in a first row of the plurality of rows N times, and after completion of scanning the first pixel in the first row, scan a second pixel in the first row of the plurality of rows N times; and wherein the controller includes circuitry to:

produce a first set of N data based on a scan of the first pixel, produce a second set of N data based on a scan of the second pixel, and produce the set of N images based on corresponding data of the first set and the second set of N data.

5. The system of any of clauses 2 to 4, wherein the controller includes circuitry to:

store the first set and the second of N data, and retrieve the corresponding data of the first set and the second set of N data to produce the set of N images.

6. The system of any of clauses 2 to 5, wherein the controller further includes circuitry to produce the set of N images by assembling a first data of the first set of N data and a first data of the second set of N data, and assembling a second data of the first set of N data and a second data of the second set of N data.

7. The system of any of clauses 1 to 6, wherein the set of N images comprise information indicating voltage contrast levels.

8. The system of clause 7, wherein the controller includes circuitry to detect a difference between the voltage contrast levels of the set of N images to identify the defect.

9. The system of any one of clauses 1 to 8, wherein the defect comprises an electrical defect associated with an electrical leakage in the high resistance structure in the area of the wafer.

10. The system of clause 9, wherein the high resistance structure enables formation of a fast charge device.

11. The system of any one of clauses 1 to 10, wherein the defect that results in the high resistance structure is caused by improper formation of a material.

12. The system of any one of clauses 1 to 10, wherein the defect that results in the high resistance structure is caused by a thin device structure.

13. The system of any one of clauses 12, wherein the thin device structure comprises a thin oxide that remains after an etching process.

14. A method of inspecting a wafer using a charged particle beam system with a charged particle beam source to deliver charged particles to a surface of the wafer over a time sequence, the method comprising:

scanning an area of the wafer, wherein the area comprises a plurality of rows of pixels;

producing a set of N images of the area over the time sequence, wherein N is an integer; and comparing the set of N images to detect a defect that results in a high resistance structure in the area of the wafer.

15. The method of clause 14, further comprising:

scanning a first row of the plurality of rows N times;

after completion of scanning the first row, scanning a second row of the plurality of rows N times;

producing a first set of N data based on a scan of the first row;

producing a second set of N data based on a scan of the second row; and producing the set of N images based on corresponding data of the first set and the second set of N data.

16. The method of clause 15, wherein:

the scanning the first row N times includes scanning the first row N times in alternate directions each time, and the scanning the second row N times includes scanning the second row N times in alternate directions each time.

17. The method of clause 14, further comprising:

scanning a first pixel in a first row of the plurality of rows N times;

after completion of scanning the first pixel in the first row, scanning a second pixel in the first row of the plurality of rows N times;

producing a first set of N data based on a scan of the first pixel;

producing a second set of N data based on a scan of the second pixel; and producing the set of N images based on corresponding data of the first set and the second set of N data.

18. The method of any clauses 15 to 17, further comprising:

storing the first set and the second of N data; and retrieving the corresponding data of the first set and the second set of N data to produce the set of N images.

19. The method of any of clauses 15 to 18, further comprising producing the set of N images by assembling a first data of the first set of N data and a first data of the second set of N data, and assembling a second data of the first set of N data and a second data of the second set of N data.

20. The method of any of clauses 14 to 19, wherein the set of N images comprise information indicating voltage contrast levels.

21. The method of clause 20, further comprising:

detecting a difference between the voltage contrast levels of the set of N images to identify the defect.

22. A non-transitory computer readable medium storing a set of instructions that is executable by a processor of a charged particle beam system to cause the charged particle beam system, with a charged particle beam source to deliver charged particles to a surface of a wafer over a time sequence, to perform a method comprising:

scanning an area of the wafer, wherein the area comprises a plurality of rows of pixels;

producing a set of N images of the area over the time sequence, wherein N is an integer; and comparing the set of N images to detect a defect that results in a high resistance structure in the area of the wafer.

23. The computer readable medium of clause 22, wherein the set of instructions that is executable by the processor of the charged particle beam system to cause the charged particle beam system to further perform:
scanning a first row of the plurality of rows N times;
after completion of scanning the first row, scanning a second row of the plurality of rows N times;
producing a first set of N data based on a scan of the first row;
producing a second set of N data based on a scan of the second row; and
producing the set of N images based on corresponding data of the first set and the second set of N data.

24. The computer readable medium of clause 23, wherein the set of instructions that is executable by the processor of the charged particle beam system to cause the charged particle beam system to further perform:
scanning the first row N times in alternate directions each time; and
scanning the second row N times in alternate directions each time.

25. The computer readable medium of clause 22, wherein the set of instructions that is executable by the processor of the charged particle beam system to cause the charged particle beam system to further perform:
scanning a first pixel in a first row of the plurality of rows N times;
after completion of scanning the first pixel in the first row, scanning a second pixel in the first row of the plurality of rows N times;
producing a first set of N data based on a scan of the first pixel;
producing a second set of N data based on a scan of the second pixel; and
producing the set of N images based on corresponding data of the first set and the second set of N data.

26. The computer readable medium of any of clauses 23 to 25, wherein the set of instructions that is executable by the processor of the charged particle beam system to cause the charged particle beam system to further perform:
storing the first set and the second of N data; and
retrieving the corresponding data of the first set and the second set of N data to produce the set of N images.

27. The computer readable medium of any of clauses 23 to 26, wherein the set of instructions that is executable by the processor of the charged particle beam system to cause the charged particle beam system to further perform producing the set of N images by assembling a first data of the first set of N data and a first data of the second set of N data, and assembling a second data of the first set of N data and a second data of the second set of N data.

28. The computer readable medium of any of clauses 22 to 27, wherein the set of instructions that is executable by the processor of the charged particle beam system to cause the charged particle beam system, wherein the set of N images comprise information indicating voltage contrast levels.

29. The computer readable medium of clause 28, wherein the set of instructions that is executable by the processor of the charged particle beam system to cause the charged particle beam system to further perform:
detecting a difference between the voltage contrast levels of the set of N images to identify the defect.

It is appreciated that the image processing system may use software to control the functionality described above. For example, the electron beam tool may control the movement of the electron beam to scan the wafer or the stage to wafer. The image processing system may reconstruct images of the wafer from the data collected while scanning the wafer. Furthermore, the image processing system may perform an image processing algorithm to adjust the brightness or contrast of the reconstructed images. The software may be stored on a non-transitory computer readable medium. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, cloud storage, a FLASH-EPROM or any other flash memory, NVRAM, a cache, a register, any other memory chip or cartridge, and networked versions of the same.

Although the disclosed embodiments have been explained in relation to its preferred embodiments, it is to be understood that other modifications and variation can be made without departing from the spirit and scope of the subject matter as hereafter claimed.

What is claimed is:

1. A charged particle beam system for inspecting a wafer, comprising:
a charged particle beam source configured to:
deliver charged particles to a surface of the wafer over a time sequence; and
scan an area of the wafer, wherein the area comprises a plurality of rows of pixels; and
a controller including one or more processors configured to cause the charged particle beam system to:
produce a set of N images of the area over the time sequence, wherein N is an integer; and
compare the set of N images to detect a defect that results in a high resistance structure in the area of the wafer.

2. The system of claim 1, wherein the charged particle beam source is further configured to:
scan a first row of the plurality of rows N times, and
after completion of scanning the first row, scan a second row of the plurality of rows N times; and
wherein the controller includes one or more processors further configured to cause the charged particle beam system to:
produce a first set of N data based on a scan of the first row,
produce a second set of N data based on a scan of the second row, and
produce the set of N images based on corresponding data of the first set and the second set of N data.

3. The system of claim 2, wherein the charged particle beam source is further configured to:
scan the first row N times in alternate directions each time, and
scan the second row N times in alternate directions each time.

4. The system of claim 2, wherein the controller includes one or more processors further configured to cause the charged particle beam system to:
store the first set and the second of N data, and
retrieve the corresponding data of the first set and the second set of N data to produce the set of N images.

5. The system of claim 2, wherein the controller includes one or more processors further configured to cause the charged particle beam system to produce the set of N images by assembling a first data of the first set of N data and a first data of the second set of N data, and assembling a second data of the first set of N data and a second data of the second set of N data.

6. The system of claim 1, wherein the charged particle beam source is further configured to:
scan a first pixel in a first row of the plurality of rows N times, and
after completion of scanning the first pixel in the first row, scan a second pixel in the first row of the plurality of rows N times; and
wherein the controller includes one or more processors further configured to cause the charged particle beam system to:
produce a first set of N data based on a scan of the first pixel,
produce a second set of N data based on a scan of the second pixel, and
produce the set of N images based on corresponding data of the first set and the second set of N data.

7. The system of claim 1, wherein the set of N images comprise information indicating voltage contrast levels.

8. The system of claim 7, wherein the controller includes one or more processors further configured to cause the charged particle beam system to detect a difference between the voltage contrast levels of the set of N images to identify the defect.

9. The system of claim 1, wherein the defect comprises an electrical defect associated with an electrical leakage in the high resistance structure in the area of the wafer.

10. The system of claim 9, wherein the high resistance structure enables formation of a fast charge device.

11. The system of claim 1, wherein the defect that results in the high resistance structure is caused by improper formation of a material.

12. The system of claim 1, wherein the defect that results in the high resistance structure is caused by a thin device structure.

13. The system of claim 12, wherein the thin device structure comprises a thin oxide that remains after an etching process.

14. A non-transitory computer readable medium storing a set of instructions that is executable by a processor of a charged particle beam system to cause the charged particle beam system, with a charged particle beam source to deliver charged particles to a surface of a wafer over a time sequence, to perform a method comprising:
scanning an area of the wafer, wherein the area comprises a plurality of rows of pixels;
producing a set of N images of the area over the time sequence, wherein N is an integer; and
comparing the set of N images to detect a defect that results in a high resistance structure in the area of the wafer.

15. The computer readable medium of claim 14, wherein the set of instructions that is executable by the processor of the charged particle beam system to cause the charged particle beam system to further perform:
scanning a first row of the plurality of rows N times;
after completion of scanning the first row, scanning a second row of the plurality of rows N times;
producing a first set of N data based on a scan of the first row;
producing a second set of N data based on a scan of the second row; and
producing the set of N images based on corresponding data of the first set and the second set of N data.

* * * * *